(12) United States Patent
Kim et al.

(10) Patent No.: US 12,185,534 B2
(45) Date of Patent: Dec. 31, 2024

(54) INTEGRATED CIRCUIT DEVICE

(71) Applicant: SAMSUNG ELECTRONICS CO., LTD., Suwon-si (KR)

(72) Inventors: Junhyoung Kim, Seoul (KR); Byunggon Park, Seoul (KR); Seungmin Lee, Seoul (KR); Kangmin Kim, Hwaseong-si (KR); Taemin Eom, Hwaseong-si (KR); Byungkwan You, Seoul (KR)

(73) Assignee: Samsung Electronics Co., Ltd.

( * ) Notice: Subject to any disclaimer, the term of this patent is extended or adjusted under 35 U.S.C. 154(b) by 530 days.

(21) Appl. No.: 17/649,562

(22) Filed: Feb. 1, 2022

(65) Prior Publication Data

US 2022/0384467 A1    Dec. 1, 2022

(30) Foreign Application Priority Data

May 26, 2021    (KR) .................. 10-2021-0067893

(51) Int. Cl.
| | |
|---|---|
| *H10B 41/40* | (2023.01) |
| *H01L 23/522* | (2006.01) |
| *H01L 23/528* | (2006.01) |
| *H01L 23/532* | (2006.01) |
| *H01L 23/538* | (2006.01) |

(Continued)

(52) U.S. Cl.
CPC ......... *H10B 41/40* (2023.02); *H01L 23/5226* (2013.01); *H01L 23/528* (2013.01); *H01L 23/5283* (2013.01); *H01L 23/53295* (2013.01); *H01L 23/5386* (2013.01); *H01L 23/60* (2013.01); *H01L 27/0255* (2013.01); *H10B 41/10* (2023.02); *H10B 41/27* (2023.02); *H10B 41/35* (2023.02); *H10B 41/50* (2023.02); *H10B 43/10* (2023.02); *H10B 43/27* (2023.02);

(Continued)

(58) Field of Classification Search
CPC . H01L 23/5226; H01L 27/0255; H10B 43/40; H10B 43/50; H10B 41/40; H10B 41/50
See application file for complete search history.

(56) References Cited

U.S. PATENT DOCUMENTS

| | | |
|---|---|---|
| 9,456,263 B1 | 9/2016 | Zhang et al. |
| 9,508,730 B2 | 11/2016 | Lee et al. |

(Continued)

FOREIGN PATENT DOCUMENTS

KR    10-2020-0073339    6/2020

*Primary Examiner* — Alia Sabur
(74) *Attorney, Agent, or Firm* — Wolf, Greenfield & Sacks, P.C.

(57) ABSTRACT

An integrated circuit device includes a substrate, a peripheral wiring circuit that includes a bypass via and is disposed on the substrate, a peripheral circuit that includes an interlayer insulating layer surrounding at least a portion of the peripheral wiring circuit, and a memory cell array disposed on and overlapping the peripheral circuit. The memory cell array includes a base substrate, a plurality of gate lines disposed on the base substrate, and a plurality of channels penetrating the plurality of gate lines. The integrated circuit device further includes a barrier layer interposed between the peripheral circuit and the memory cell array. The barrier layer includes a bypass hole penetrating from a top surface to a lower surface of the barrier layer. The bypass via is disposed in the bypass hole.

20 Claims, 33 Drawing Sheets

(51) Int. Cl.
    *H01L 23/60*     (2006.01)
    *H01L 27/02*     (2006.01)
    *H10B 41/10*     (2023.01)
    *H10B 41/27*     (2023.01)
    *H10B 41/35*     (2023.01)
    *H10B 41/50*     (2023.01)
    *H10B 43/10*     (2023.01)
    *H10B 43/27*     (2023.01)
    *H10B 43/35*     (2023.01)
    *H10B 43/40*     (2023.01)
    *H10B 43/50*     (2023.01)

(52) U.S. Cl.
    CPC ............. *H10B 43/35* (2023.02); *H10B 43/40* (2023.02); *H10B 43/50* (2023.02); *H01L 2225/06544* (2013.01)

(56) References Cited

U.S. PATENT DOCUMENTS

| | | | |
|---|---|---|---|
| 9,548,316 B2 | 1/2017 | Lim et al. | |
| 10,388,661 B2 | 8/2019 | Park et al. | |
| 10,468,486 B2 | 11/2019 | Wu et al. | |
| 10,910,396 B2 | 2/2021 | Kim et al. | |
| 2017/0338241 A1* | 11/2017 | Lee | H10B 43/50 |
| 2018/0323207 A1* | 11/2018 | Shim | H10B 43/10 |
| 2019/0371800 A1* | 12/2019 | Nishikawa | H10B 41/35 |
| 2020/0091185 A1* | 3/2020 | Baek | H10B 43/50 |
| 2020/0194453 A1 | 6/2020 | Um | |
| 2021/0296236 A1* | 9/2021 | Shirai | H10B 43/35 |
| 2022/0037234 A1* | 2/2022 | Wu | H10B 43/40 |
| 2022/0285383 A1* | 9/2022 | Kubota | H01L 29/8613 |

\* cited by examiner

II - II'

INTEGRATED CIRCUIT DEVICE

CROSS-REFERENCE TO RELATED APPLICATIONS

This application claims priority under 35 U.S.C. § 119 to Korean Patent Application No. 10-2021-0067893, filed on May 26, 2021, in the Korean Intellectual Property Office, the disclosure of which is incorporated by reference herein in its entirety.

TECHNICAL FIELD

The inventive concept relates to a memory device, and more particularly, to an integrated circuit device.

DISCUSSION OF RELATED ART

Communication devices such as personal computers, laptops, tablets, mobile phones, and the like are increasingly capable of performing multiple functions, and there is a consequent demand for integrated circuit devices such as memory devices that have high capacities and are highly integrated. However, as memory cell sizes of the integrated circuit devices are reduced in order to accommodate the demand for integration with the communication devices, the complexity of operation circuits and wiring structures that are included in the integrated circuit devices for operations and electrical connections is increasing.

SUMMARY

The inventive concept provides an integrated circuit device having structural reliability with a high degree of integration and excellent electrical characteristics. In some embodiments, an integrated circuit device according to embodiments of the inventive concept includes a nonvolatile memory device that includes a cell over periphery (COP) structure.

According to an embodiment of the inventive concept, an integrated circuit device includes a substrate, a peripheral wiring circuit that includes a bypass via and is disposed on the substrate, a peripheral circuit that includes an interlayer insulating layer surrounding at least a portion of the peripheral wiring circuit, and a memory cell array disposed on and overlapping the peripheral circuit. The memory cell array includes a base substrate, a plurality of gate lines disposed on the base substrate, and a plurality of channels penetrating the plurality of gate lines. The integrated circuit device further includes a barrier layer interposed between the peripheral circuit and the memory cell array. The barrier layer includes a bypass hole penetrating from a top surface to a lower surface of the barrier layer. The bypass via is disposed in the bypass hole. Each of at least a portion of the barrier layer and at least a portion of the base substrate includes a sequentially stacked conductive material layer, insulating material layer, semiconductor material layer, insulating material layer that includes oxide/nitride/oxide (ONO) layers, and semiconductor material layer.

According to an embodiment of the inventive concept, an integrated circuit device includes a substrate, a peripheral wiring circuit that includes a peripheral circuit contact, a peripheral circuit wiring layer, and a bypass via and is disposed on the substrate, a peripheral circuit that includes an interlayer insulating layer surrounding the peripheral circuit contact and the peripheral circuit wiring layer, and a memory cell array disposed on and overlapping the peripheral circuit. The memory cell array includes a substrate layer, a plurality of gate lines arranged on the substrate layer, and a plurality of channels penetrating the plurality of gate lines. The integrated circuit device further includes a barrier layer interposed between the peripheral circuit and the memory cell array. The barrier layer includes a first barrier layer covering the interlayer insulating layer and a second barrier layer covering the first barrier layer. The barrier layer further includes a bypass hole exposing at least a portion of the peripheral circuit wiring layer. The bypass via is disposed in the bypass hole. The integrated circuit device further includes a cover layer interposed between the first barrier layer and the bypass via.

According to an embodiment of the inventive concept, an integrated circuit device includes a peripheral circuit transistor disposed on a substrate, a peripheral wiring circuit that includes a peripheral circuit contact, a peripheral circuit wiring layer, and a bypass via and is electrically connected to the peripheral circuit transistor, a peripheral circuit surrounding the peripheral circuit contact and the peripheral circuit wiring layer, a memory cell array disposed on and overlapping the peripheral circuit, a substrate layer, a lower base layer, and an upper base layer that are sequentially stacked, a plurality of gate lines arranged on the upper base layer, a plurality of channels disposed in a plurality of channel holes penetrating the plurality of gate lines, and a barrier layer interposed between the peripheral circuit and the memory cell array. The barrier layer includes a first barrier layer covering the interlayer insulating layer and a second barrier layer covering the first barrier layer. The barrier layer further includes a bypass hole exposing at least a portion of the peripheral circuit wiring layer. A bypass via that includes a same material as and is formed integrally with the substrate layer is disposed in the bypass hole. The integrated circuit device further includes a cover layer interposed between the bypass via and the first barrier layer, a base insulating layer disposed in a plurality of holes penetrating the base substrate and the barrier layer, a plurality of conductive lines arranged on the memory cell array, and a plurality of through electrodes penetrating the memory cell array and the base insulating layer to connect the plurality of conductive lines to the peripheral wiring circuit. The base insulating layer is disposed between the plurality of through electrodes and the barrier layer.

BRIEF DESCRIPTION OF THE DRAWINGS

The above and other features of the present inventive concept will become more apparent by describing in detail embodiments thereof with reference to the accompanying drawings, in which.

DETAILED DESCRIPTION

Figure 1:
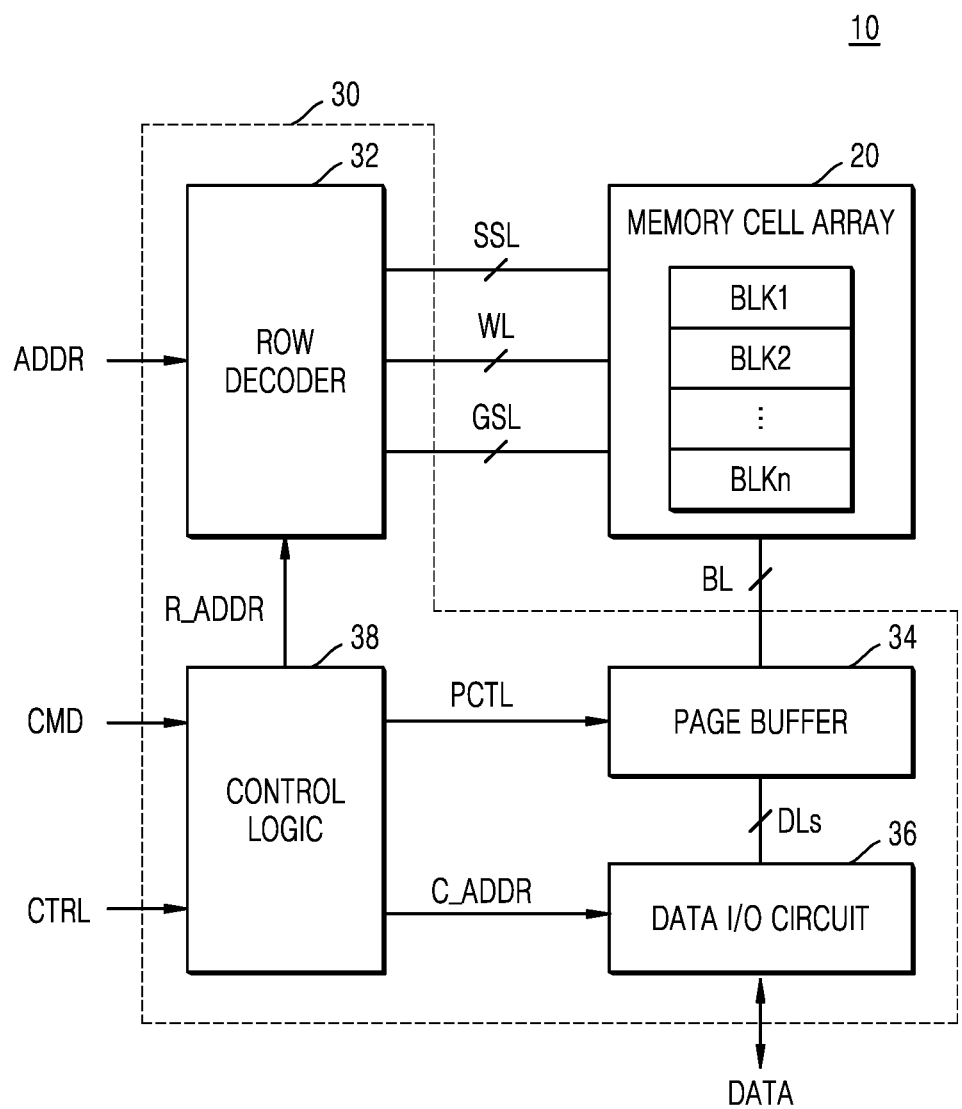
FIG. 1 is a block diagram of an integrated circuit device according to embodiments of the inventive concept.

Embodiments of the inventive concept will be described more fully hereinafter with reference to the accompanying drawings. Like reference numerals may refer to like elements throughout the accompanying drawings.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, a first element, component, region, layer, or section discussed below could be termed a second element, component, region, layer, or section without departing from the teachings of the embodiments.

As used herein, the singular forms "a," "an" and "the" are intended to include the plural forms as well, unless the context clearly indicates otherwise.

FIG. 1 is a block diagram of an integrated circuit device 10 according to embodiments of the inventive concept.

Referring to FIG. 1, the integrated circuit device 10 may include a memory cell array 20 and a peripheral circuit 30. The memory cell array 20 includes a plurality of memory cell blocks BLK1, BLK2, ..., BLKn. Each of the plurality of memory cell blocks BLK1, BLK2, ..., BLKn may include a plurality of memory cells. The plurality of memory cell blocks BLK1, BLK2, ..., BLKn may be connected to the peripheral circuit 30 through one or more bit lines BL, one or more word lines WL, one or more string selection lines SSL, and one or more ground selection lines GSL.

The peripheral circuit 30 may include a row decoder 32, a page buffer 34, a data input/output circuit 36, and a control logic 38. In some embodiments, the peripheral circuit 30 may include an input/output interface, column logic, a voltage generator, a pre-decoder, a temperature sensor, a command decoder, an address decoder, an amplifier circuit, etc.

The memory cell array 20 may be connected to the page buffer 34 through the bit line BL, and may be connected to the row decoder 32 through the word line WL, the string selection line SSL, and the ground selection line GSL. In the memory cell array 20, each memory cell of the plurality of memory cells included in the plurality of memory cell blocks BLK1, BLK2, ..., BLKn may be a flash memory cell. The memory cell array 20 may include a three-dimensional (3D) memory cell array. The 3D memory cell array may include a plurality of NAND strings, and each NAND string of the plurality of NAND strings may include a plurality of memory cells connected to of the one or more word lines WL. In an embodiment, the one or more word lines WL may be stacked vertically on a substrate.

The peripheral circuit 30 may receive an address ADDR, a command CMD, and a control signal CTRL from outside of the integrated circuit device 10, and may transmit and receive data DATA to and from a device that is external to the integrated circuit device 10.

The row decoder 32 may select at least one memory block of the plurality of memory cell blocks BLK1, BLK2, ..., BLKn in response to receiving the address ADDR, and may select the word line WL, the string selection line SSL, and the ground selection line GSL of the selected memory cell block. The row decoder 32 may transmit a voltage for performing a memory operation to the word line WL of the selected memory cell block.

The page buffer 34 may be connected to the memory cell array 20 through the bit line BL. The page buffer 34 may operate as a write driver during a program operation to apply a voltage according to the data DATA to be stored in the memory cell array 20 to the bit line BL, and may operate as a sense amplifier during a read operation to sense the data DATA stored in the memory cell array 20. The page buffer 34 may operate according to a control signal PCTL provided from the control logic 38.

The data input/output circuit 36 may be connected to the page buffer 34 through data lines DLs. The data input/output circuit 36 may receive the data DATA from a memory controller during the program operation, and may provide program data DATA to the page buffer 34 based on a column address C_ADDR provided from the control logic 38. The data input/output circuit 36 may provide the read data DATA stored in the page buffer 34 to the memory controller based on the column address C_ADDR provided from the control logic 38 during the read operation.

The data input/output circuit 36 may transmit an input address or command to the control logic 38 and/or the row decoder 32. In an embodiment, the peripheral circuit 30 may include an electrostatic discharge (ESD) circuit and a pull-up/pull-down driver.

The control logic 38 may receive the command CMD and the control signal CTRL from the memory controller. The control logic 38 may provide a row address R_ADDR to the row decoder 32 and may provide a column address C_ADDR to the data input/output circuit 36. The control logic 38 may generate various internal control signals used in the integrated circuit device 10 in response to the control signal CTRL. For example, the control logic 38 may adjust a voltage level provided to the word line WL and the bit line BL when a memory operation such as a program operation or an erase operation is performed.

Figure 2:
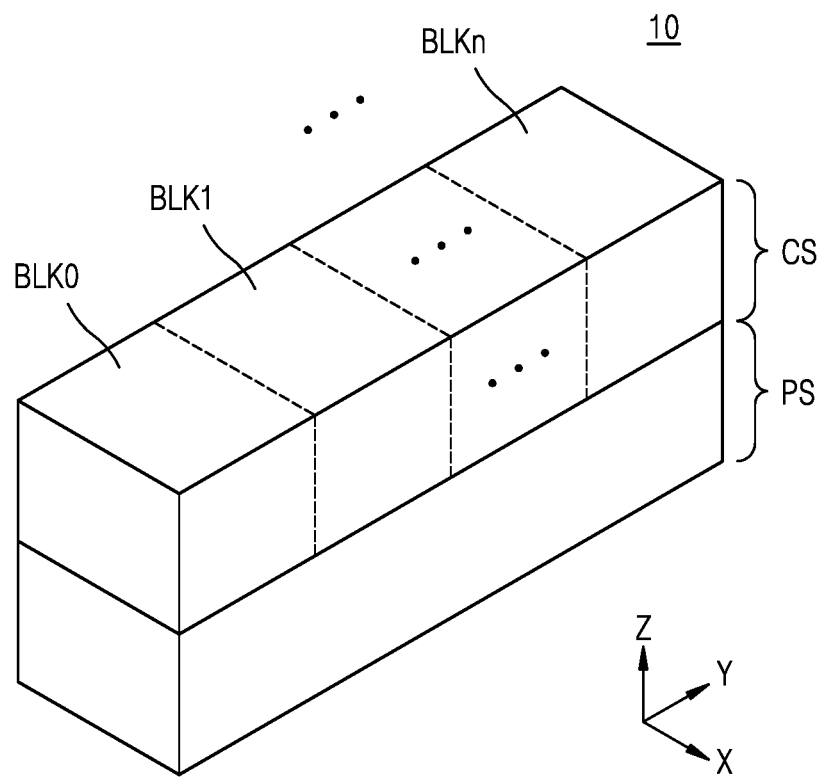
FIG. 2 is a schematic perspective view of an integrated circuit device according to embodiments of the inventive concept.

FIG. 2 is a schematic perspective view of the integrated circuit device 10 according to embodiments of the inventive concept.

Referring to FIG. 2, the integrated circuit device 10 includes a memory cell array CS that overlaps a peripheral circuit PS in a vertical direction (Z direction) and extends in a second horizontal direction (Y direction) that is perpendicular to the vertical direction and a first horizontal direction (X direction). For example, the memory cell array CS is disposed above the peripheral circuit PS. The memory cell array CS may include the memory cell array 20 described with reference to FIG. 1. The peripheral circuit PS may include the peripheral circuit 30 described with reference to FIG. 1.

The memory cell array CS may include the plurality of memory cell blocks BLK1, BLK2, . . . , BLKn. Each memory cell block of the plurality of memory cell blocks BLK1, BLK2, . . . , BLKn may include three-dimensionally arranged memory cells.

Figure 3:
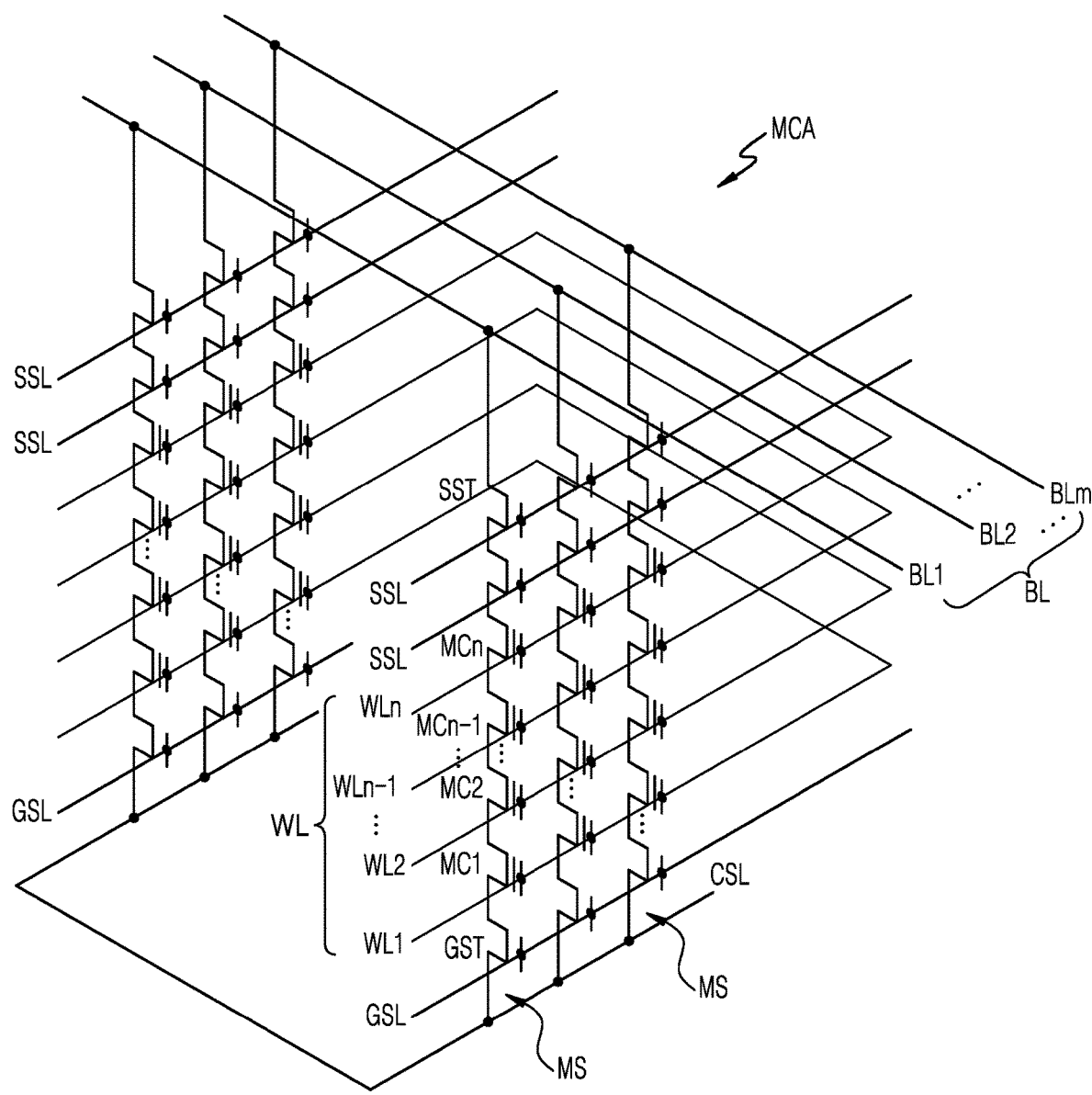
FIG. 3 is an equivalent circuit diagram of a memory cell array of an integrated circuit device according to embodiments of the inventive concept.

FIG. 3 is an equivalent circuit diagram of a memory cell array MCA of an integrated circuit device according to embodiments of the inventive concept.

Referring to FIG. 3, the memory cell array MCA may include a plurality of memory cell strings MS. The memory cell array MCA may include a plurality of bit lines BL (e.g., BL1, BL2, . . . , BLm), a plurality of word lines WL (e.g., WL1, WL2, . . . , WLn−1, WLn), and at least one string selection line SSL, at least one ground selection line GSL, and a common source line CSL. The plurality of memory cell strings MS may be formed between the plurality of bit lines BL and the common source line CSL. FIG. 3 illustrates a case in which each memory cell string of the plurality of memory cell strings MS includes two string selection lines SSL, but embodiments of the inventive concept are not necessarily limited thereto. For example, in some embodiments, each memory cell string of the plurality of memory cell strings MS may include one string selection line SSL.

Each memory cell string of the plurality of memory cell strings MS may include a string selection transistor SST, a ground selection transistor GST, and a plurality of memory cell transistors MC1, MC2, . . . , MCn−1, MCn. A drain region of the string selection transistor SST may be connected to the plurality of bit lines BL, and a source region of the ground selection transistor GST may be connected to the common source line CSL. The common source line CSL may be a region to which source regions of a plurality of ground selection transistors GST are commonly connected.

The string selection transistor SST may be connected to one or more string selection lines SSL, and the ground selection transistor GST may be connected to the ground selection line GSL. Each memory cell transistor of the plurality of memory cell transistors MC1, MC2, . . . , MCn−1, MCn may be respectively connected to a word line of the plurality of word lines WL.

Figure 4A:
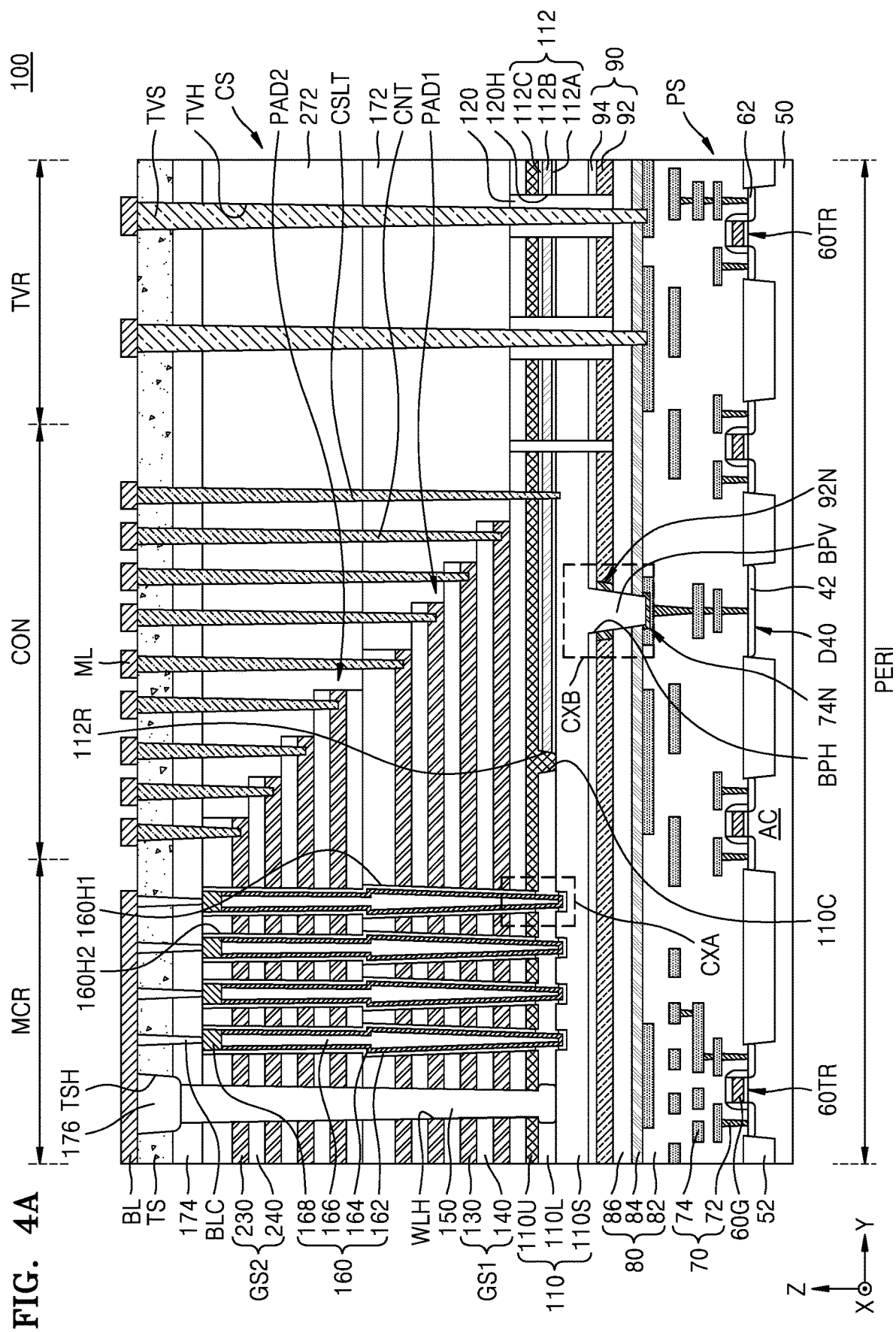
FIGS. 4A to 4C are cross-sectional views of an integrated circuit device according to embodiments of the inventive concept.
Figure 4B:
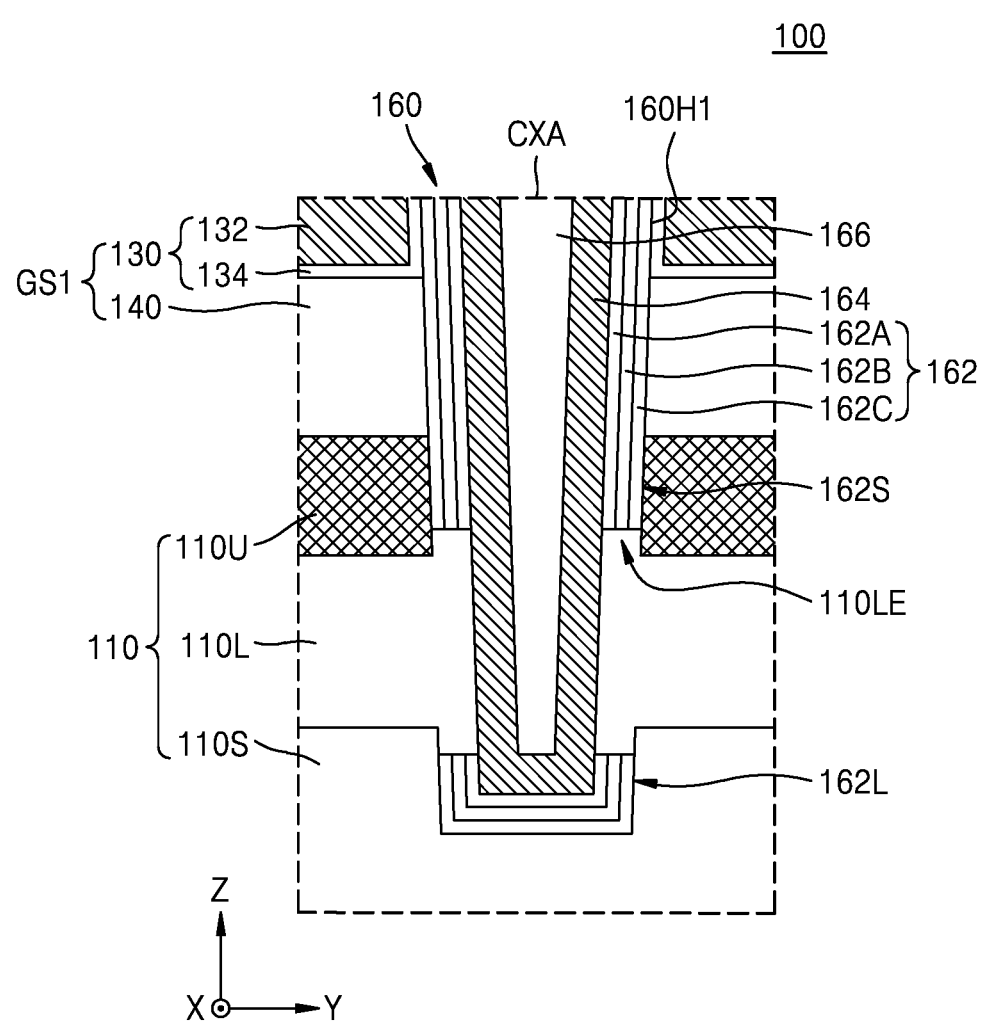
Figure 4C:
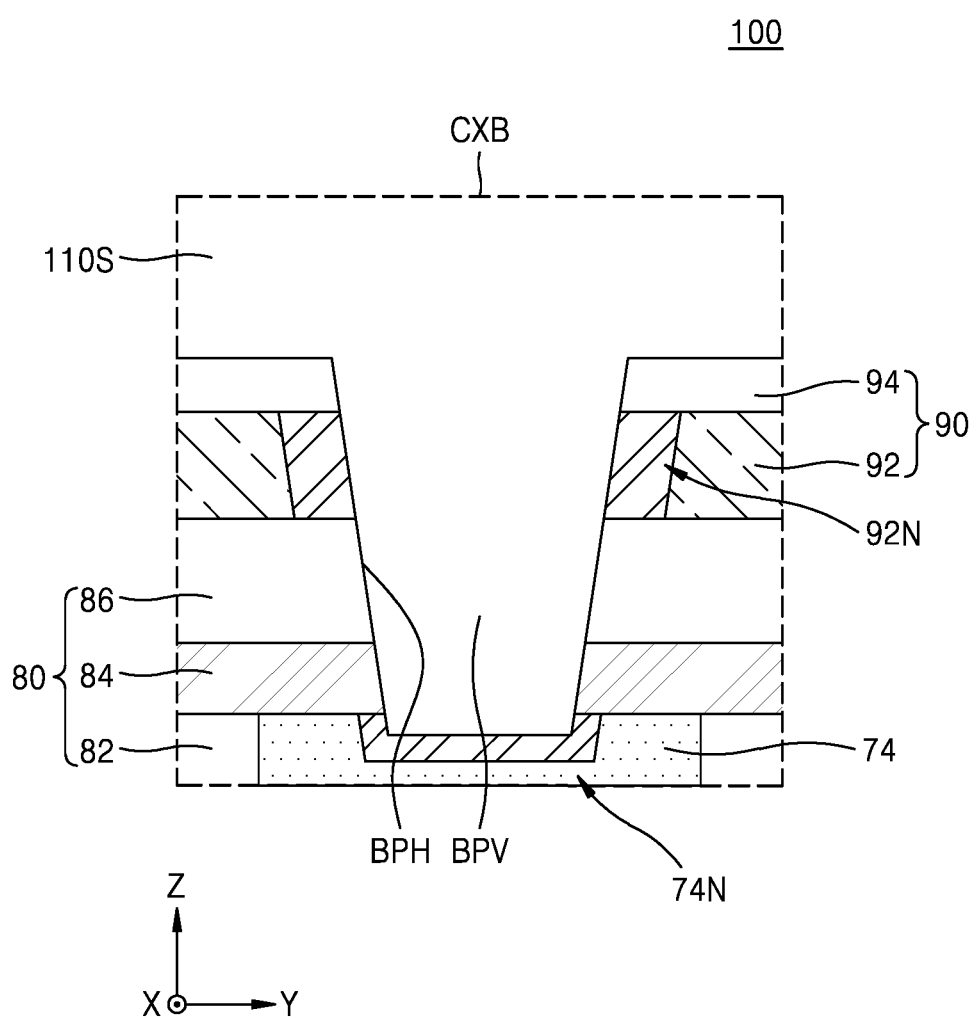

FIGS. 4A to 4C are cross-sectional views of an integrated circuit device 100 according to embodiments of the inventive concept. Specifically, FIG. 4B is an enlarged cross-sectional view of a region CXA of FIG. 4A, and FIG. 4C is an enlarged cross-sectional view of a region CXB of FIG. 4A. In FIG. 4A, only some components of the integrated circuit device 100 are schematically shown for convenience of illustration and understanding. Integrated circuit device 100 is an example of, or includes aspects of, the integrated circuit device 10 described with reference to FIG. 1.

Referring to FIGS. 4A to 4C, the integrated circuit device 100 may include the peripheral circuit PS and the memory cell array CS. The memory cell array CS may be disposed at a higher vertical level (i.e., higher in the Z direction) than the peripheral circuit PS. For example, the memory cell array CS may be disposed above the peripheral circuit PS. The memory cell array CS may include a memory cell region MCR, a connection region CON, and a through electrode region TVR, and the peripheral circuit PS may include a peripheral circuit region PERI.

The memory cell region MCR may be a region in which a memory cell array MCA of a vertical channel NAND type driven in the manner described with reference to FIG. 3 is formed. The connection region CON may be a region in which a plurality of pad contacts CNT for electrical connection between the memory cell array MCA and the peripheral circuit region PERI is disposed. The peripheral circuit region PERI may be disposed at a lower vertical level (i.e., lower in the Z direction) than the memory cell region MCR. For example, the peripheral circuit region PERI may be disposed below the memory cell region MCR. The through electrode region TVR may be a region in which a plurality of through electrodes TVS for electrical connection between the memory cell region MCR and the peripheral circuit region PERI are disposed.

The peripheral circuit PS may include a plurality of peripheral circuit transistors 60TR and a peripheral wiring circuit 70 disposed on the substrate 50. In the substrate 50, an active region AC may be delimited by the device separation layer 52, and the plurality of peripheral circuit transistors 60TR may be formed on the active region AC. Each peripheral circuit transistor of the plurality of peripheral circuit transistors 60TR may include a peripheral circuit gate 60G and source/drain regions 62. The peripheral circuit gate 60G and the source/drain regions 62 may be disposed in the substrate 50 and the peripheral circuit gate 60G may be disposed between the source/drain regions 62.

The substrate 50 may include a semiconductor material such as a group IV semiconductor, a group III-V compound semiconductor, or a group II-VI oxide semiconductor. For example, the group IV semiconductor may include silicon (Si), germanium (Ge), or silicon-germanium (SiGe). In some embodiments, the substrate 50 may be provided as a bulk wafer or an epitaxial layer. In some other embodiments, the substrate 50 may include a silicon-on-insulator (SOI) substrate or a germanium-on-insulator (GeOI) substrate.

The peripheral wiring circuit 70 includes a plurality of peripheral circuit contacts 72 and a plurality of peripheral circuit wiring layers 74. An interlayer insulating layer 80 surrounding the peripheral circuit transistor 60TR and the peripheral wiring circuit 70 may be disposed on the substrate 50. The interlayer insulating layer 80 may surround the plurality of peripheral circuit contacts 72 and the plurality of peripheral circuit wiring layers 74. The plurality of peripheral circuit wiring layers 74 may have a multilayer structure that includes a plurality of metal layers disposed at different vertical levels. The peripheral circuit wiring layers of the plurality of peripheral circuit wiring layers 74 may be disposed at different levels from each other. Although it is illustrated in FIG. 4A that the plurality of peripheral circuit wiring layers 74 all have the same height (i.e., thickness in the vertical direction), a first peripheral circuit wiring layer of the plurality of peripheral circuit wiring layers 74 disposed at a first level (e.g., disposed at an uppermost level) may have a greater height than that of a second peripheral circuit wiring layer of the plurality of peripheral circuit wiring layers 74 disposed on a second level that is different than the first level.

At least one antenna diode D40 may be disposed on the substrate 50. The antenna diode D40 may include a diode ion injection region 42. In some embodiments, the active region AC of the substrate 50 may include an ion injection region of a first conductivity type, and the diode ion injection region 42 may include an ion injection region of a second conductivity type that is different from the first conductivity type. The first conductivity type ion injection region and the second conductivity type ion injection region may form a PN junction diode. In some embodiments, the diode ion injection region 42 may have the same conductivity type as a source/drain region 62.

The interlayer insulating layer 80 may include a first interlayer insulating layer 82, a passivation layer 84 disposed above the first interlayer insulating layer 82, and a second interlayer insulating layer 86 that are sequentially stacked. For example, the passivation layer 84 may be disposed above the first interlayer insulating layer 82, and a second interlayer insulating layer 86 may be disposed above the passivation layer 84. The first interlayer insulating layer 82 may surround the peripheral wiring circuit 70. In some embodiments, a top surface of the first interlayer insulating layer 82 and a top surface of an uppermost peripheral circuit wiring layer of the plurality of peripheral circuit wiring layers 74 may be coplanar. The passivation layer 84 may cover the top surface of the first interlayer insulating layer 82 and the top surface of the uppermost peripheral circuit wiring layer. The second interlayer insulating layer 86 may cover the passivation layer 84. In some embodiments, the first interlayer insulating layer 82 and the second interlayer insulating layer 86 may include oxide, and the passivation layer 84 may include nitride. In some embodiments, the first interlayer insulating layer 82 and the second interlayer insulating layer 86 may include silicon oxide and the passivation layer 84 may include silicon nitride.

A barrier layer 90 may be interposed between the peripheral circuit PS and the memory cell array CS. The barrier layer 90 may be disposed on the interlayer insulating layer 80. In some embodiments, the barrier layer 90 may have a stacked structure in which a first barrier layer 92 covers the interlayer insulating layer 80 and a second barrier layer 94 covers the first barrier layer 92. The first barrier layer 92 may include the same material as a substrate layer 110S, which will be described later, or may include a material that has a same or similar etching characteristic as the substrate layer 110S. For example, the first barrier layer 92 may be a conductive material layer, and the second barrier layer 94 may be an insulating material layer. In some embodiments, the first barrier layer 92 may include a semiconductor material, and the second barrier layer 94 may include oxide or nitride. For example, the first barrier layer 92 may include polysilicon, and the second barrier layer 94 may include silicon oxide or silicon nitride. The thickness of the first barrier layer 92 (e.g., a thickness in the vertical direction) may be greater than the thickness of the second barrier layer 94 (e.g., a thickness in the vertical direction).

A bypass hole BPH may penetrate from a top surface to a lower surface of the barrier layer 90 and may penetrate a part of the interlayer insulating layer 80. At least one peripheral wiring layer of the plurality of peripheral circuit wiring layers 74 of the peripheral wiring circuit 70 may be at least partially exposed by the bypass hole BPH.

A base substrate 110 may be disposed on the barrier layer 90. The base substrate 110 may include a substrate layer 110S, a lower base layer 110L, and an upper base layer 110U sequentially stacked on the interlayer insulating layer 80. For example, the base substrate 110 may be disposed above the interlayer insulating layer 80, the lower base layer 110L may be disposed above the substrate later 110S, and the upper base layer 110U may be disposed above the lower base layer 110L Each of the substrate layer 110S, the lower base layer 110L, and the upper base layer 110U may be a semiconductor material layer. The substrate layer 110S may include a semiconductor material such as silicon. For example, the substrate layer 110S may include polysilicon. The lower base layer 110L may include polysilicon doped with impurities, polysilicon undoped with impurities, metal, or a combination thereof, and the upper base layer 110U may include polysilicon doped with impurities, polysilicon undoped with impurities, metal, or a combination thereof. The lower base layer 110L may correspond to the common source line CSL described with reference to FIG. 3. In some embodiment, the lower base layer 110L is an example of, or includes aspects of, the common source line CSL described with reference to FIG. 3.

In at least one portion of each of the through electrode region TVR and the connection region CON, an insulating plate 112 may be interposed (i.e., sequentially stacked) between the substrate layer 110S and the upper base layer 110U in at least one portion of the base substrate 110, and the lower base layer 110L may be omitted. In some embodiments, the insulating plate 112 may be an insulating material layer that includes an oxide/nitride/oxide (ONO) structure. For example, the insulating plate 112 may include an insulating layer of a multilayer structure that includes a first insulating layer 112A, a second insulating layer 112B, and a third insulating layer 112C sequentially stacked on substrate layer 110S. For example, the second insulating layer 112B may be disposed above the first insulating layer 112A, and the third insulating layer 112C may be disposed above the second insulating layer 112B. In some embodiments, the first insulating layer 112A and the third insulating layer 112C may include a silicon oxide layer, and the second insulating layer 112B may include a silicon nitride layer.

In the memory cell region MCR, a portion of the base substrate 110 in which the substrate layer 110S, the lower base layer 110L, and the upper base layer 110U are sequentially stacked may be disposed on the barrier layer 90, and a portion of the base substrate 110 in which the substrate layer 110S, the insulating plate 112, and the upper base layer 110U are sequentially stacked may be disposed on at least a portion of each of the through electrode region TVR and the connection region CON.

In some embodiments, in the memory cell region MCR, the barrier layer 90 and the base substrate 110 may include a sequentially stacked first barrier layer 92 as a conductive material layer, second barrier layer 94 as an insulating material layer, substrate layer 110s as a semiconductor material layer, lower base layer 110L as a semiconductor material layer, and upper base layer 110U as a semiconductor material layer. For example, the second barrier layer 94 may be disposed above the first barrier layer 92, the substrate layer 110S may be disposed above the second barrier layer 94, the lower base layer 110L may be disposed above the substrate layer 110S, and the upper base layer 110U may be disposed above the lower base layer 110L. In some embodiments, in at least a portion of each of the through electrode region TVR and the connection region CON, the barrier layer 90 and the base substrate 110 may include a sequentially stacked first barrier layer 92 as a conductive material layer, second barrier layer 94 as an insulating material layer, substrate layer 110S as a semiconductor material layer, insulating plate 112 as an insulating material layer that includes an ONO structure, and upper base layer 110U as a semiconductor material layer. For example, the second barrier layer 94 may be disposed above the first barrier layer 92, the substrate layer 110S may be disposed above the second barrier layer 94, the insulating plate 112 may be disposed above the substrate layer 110S, and the upper base layer 110U may be disposed above the insulating plate 112.

A base dam portion 110C may be interposed between the insulating plate 112 and the lower base layer 110L. The base dam portion 110C may be integrally formed together with the upper base layer 110U. A lower surface of the base dam portion 110C may contact a top surface of the substrate layer 110S. The base dam portion 110C may be positioned between the memory cell region MCR and the through electrode region TVR. In some embodiments, the base dam portion 110C may be positioned in the connection area CON.

The base dam portion 110C may be formed by forming a plate recess 112R penetrating the insulating plate 112 and then filling the plate recess 112R when the upper base layer 110U is formed. The lower base layer 110L may be formed by removing a portion of the insulating plate 112 through a gate stack separation hole WLH, which will be described later, and then filling a space that is formed when the portion of the insulating plate 112 is removed. The base dam portion 110C may be interposed between the portion of the insulating plate 112 that has been removed to form the lower base layer 110L and a remaining portion of the insulating plate 112 that has not been removed. The base dam portion 110C may function as a barrier to prevent the remaining portion of the insulating plate 112 from being removed during the process of removing the portion of the insulating plate 112 to form the lower base layer 110L.

The upper base layer 110U may serve as a support layer for preventing a mold stack from collapsing or falling during the process of removing the portion of the insulating plate 112 to form the lower base layer 110L. The barrier layer 90 is not removed when a portion of the substrate layer 110S is removed during a manufacturing process, and thus the barrier layer 90 may act as a structural support layer that is required for a subsequent process.

The peripheral wiring circuit 70 may further include a bypass via BPV that is filled in (e.g., disposed in) the bypass hole BPH. The bypass via BPV may electrically connect the substrate layer 110S and the diode ion injection region 42 of the substrate 50. In some embodiments, the bypass via BPV may include the same material as the substrate layer 110S and may be integrally formed with the substrate layer 110S. In some embodiments, a semiconductor material may be formed on the barrier layer 90 to form the substrate layer 110S, and the bypass via BPV may be formed by partially filling the semiconductor material in the bypass hole BPH. The bypass via BPV may be electrically connected to the diode ion injection region 42 through a portion of the peripheral wiring circuit 70. In FIG. 4A, the bypass via BPV is electrically connected to the diode ion injection region 42 through the plurality of peripheral circuit contacts 72 and the plurality of peripheral circuit wiring layers 74, where the peripheral circuit wiring layers of the plurality of peripheral circuit wiring layers 74 are disposed at different vertical levels, but embodiments of the inventive concept are not necessarily limited thereto. For example, in some embodiments, a single contact that includes a top surface that contacts the bypass via BPV and a lower surface that contacts the diode ion injection region 42 may be interposed between the bypass via BPV and the diode ion injection region 42.

In some embodiments, a cover layer 92N may be interposed between the bypass via BPV and the first barrier layer 92. Referring to FIG. 4C, the cover layer 92N may be omitted between the bypass via BPV and the second barrier layer 94. In some embodiments, the cover layer 92N may be a nitride formed by nitriding a portion of the first barrier layer 92 exposed to the bypass hole BPH by a plasma nitriding (PN) process. In some embodiments, the cover layer 92N may be an oxide formed by oxidizing a portion of the first barrier layer 92 exposed by the bypass hole BPH. The cover layer 92N and the second barrier layer 94 may include a material different from a material included in the substrate layer 110S. In some embodiments, the cover layer 92N and the second barrier layer 94 may include a material that is resistant to an etching of the substrate layer 110S. The cover layer 92N and the second barrier layer 94 may together prevent the first barrier layer 92 from being removed when a portion of the substrate layer 110S is removed during the manufacturing process.

In some embodiments, a cover contact layer 74N may be interposed between the bypass via BPV and the plurality of peripheral circuit wiring layers 74. For example, the cover contact layer 74N may be a conductive metal nitride formed by nitriding, by the plasma nitridation process of forming the cover layer 92N, a portion of a peripheral circuit wiring layer of the plurality of peripheral circuit wiring layers 74 exposed by the bypass hole BPH.

A plurality of holes 120H may be formed in a region of the integrated circuit device 100 in which the substrate layer 110S, the insulating plate 112, and the upper base layer 110U adjacent to the plurality of through electrodes TVS are sequentially stacked. The plurality of holes 120H may penetrate the substrate layer 110S, the insulating plate 112, and the upper base layer 110U, and the interlayer insulating layer 80 may be at least partially exposed by the plurality of holes 120H. The base insulating layer 120 may fill (e.g., be disposed in) the plurality of holes 120H.

A first gate stack GS1 may be disposed on the base substrate 110, and a second gate stack GS2 may be disposed on the first gate stack GS1. The first gate stack GS1 may extend on the base substrate 110 in the first horizontal direction (X direction) and the second horizontal direction (Y direction) parallel to a top surface of the base substrate 110. The second gate stack GS2 may extend on the first gate stack GS1 in the first horizontal direction (X direction) and the second horizontal direction (Y direction) parallel to the top surface of the base substrate 110.

The first gate stack GS1 may include first gate lines 130 and first base insulating layers 140. The first gate lines 130 may be alternately stacked with the first base insulating layers 140 in the vertical direction (Z direction), such that a first base insulating layer 140 is interposed between pairs of the first gate lines 130. A first base insulating layer 140 may also be interposed between the bottommost first gate line 130 and the base substrate 110. The second gate stack GS2 may include second gate lines 230 and second base insulating layers 240. The second gate lines 230 may be alternately stacked with the second base insulating layers 240 in the vertical direction (Z direction), such that a second base insulating layer 240 is interposed between pairs of the second gate lines 230. A second base insulating layer 240 may also be interposed between the bottommost second gate line 230 and the first gate stack GS1. For example, the first gate lines 130 and the first base insulating layers 140 may be alternately arranged in the vertical direction (Z direction) perpendicular to the top surface of the base substrate 110, and the second gate lines 230 and the second base insulating layers 240 may be alternately arranged in the vertical direction (Z direction) perpendicular to the top surface of the base substrate 110.

In some embodiments, each first gate line 130 and each second gate line 230 may include a metal such as tungsten, nickel, cobalt, tantalum, etc., a metal silicide such as tungsten silicide, nickel silicide, cobalt silicide, tantalum silicide, etc., doped polysilicon, or a combination thereof. In some embodiments, the integrated circuit device 100 may include a dielectric liner that surrounds at least a portion of top surfaces, bottom surfaces, and side surfaces of each first gate line 130 and each second gate line 230. In some embodiments, the dielectric liner may include a high dielectric material such as aluminum oxide.

In some embodiments, the first gate lines 130 and the second gate lines 230 may correspond to the ground selection line GSL, the plurality of word lines WL, and at least one string selection line SSL constituting the plurality of memory cell strings MS described with reference to FIG. 3. For example, a lowermost first gate line 130 may function as a ground selection line GSL, an uppermost second gate line 230 may function as a string selection line SSL, and remaining first gate lines 130 and remaining second gate lines 230 may function as word lines of the plurality of word lines WL. Accordingly, memory cell strings of the plurality of memory cell strings MS may be provided, in which a ground selection transistor GST, a selection transistor SST, and a plurality of memory cell transistors MC1, MC2, . . . , MCn−1, MCn disposed therebetween are connected in series. In some embodiments, at least one first gate line 130 and at least one second gate line 230 may each function as a dummy word line.

A plurality of channels 160 may penetrate the first gate stack GS1 and the second gate stack GS2 from the top surface of the base substrate 110 in the memory cell region MCR to extend in the vertical direction (Z direction). The plurality of channels 160 may be formed in a plurality of first channel holes 160H1 penetrating the first gate stack GS1 and a plurality of second channel holes 160H2 penetrating the second gate stack GS2.

In some embodiments, each first channel hole of the plurality of first channel holes 160H1 may extend in the vertical direction (Z direction) toward the base substrate 110 and may have a generally tapered shape in which a horizontal width and a horizontal breadth are reduced as the first channel hole extends downward, and each second channel hole of the plurality of second channel holes 160H2 may extend in the vertical direction (Z direction) toward the base substrate 110 and may have a generally tapered shape in which a horizontal width and a horizontal breadth are reduced as the second channel hole extends downwards. Each first channel hole of the plurality of first channel holes 160H1 may correspond to a second channel hole of the plurality of second channel holes 160H2, and each first channel hole of the plurality of first channel holes 160H1 may communicate with and contact a corresponding second channel hole. Each channel of the plurality of channels 160 may protrude outward from a boundary between a first channel hole of the plurality of first channel holes 160H1 and a second channel hole of the plurality of second channel holes 160H2.

The channels of the plurality of channels 160 may be spaced apart from each other by a certain space in the first horizontal direction (X direction), the second horizontal direction (Y direction), and a third horizontal direction (e.g., a diagonal direction coplanar with and intersecting both the X direction and the Y direction). The plurality of channels 160 may be arranged in a zigzag shape or a staggered shape.

A channel of the plurality of channels 160 may be disposed in a first channel hole of the plurality of first channel holes 160H1 and a second channel hole of the plurality of second channel holes 160H2 that communicate with each other. Each channel of the plurality of channels 160 may include a gate insulating layer 162, a channel layer 164, a filling insulating layer 166, and a conductive plug 168. A gate insulating layer 162 and a channel layer 164 may be sequentially arranged in outer regions of a first channel hole of the plurality of first channel holes 160H1 and a second channel hole of the plurality of second channel holes 160H2 that communicate with each other. For example, the gate insulating layer 162 may be conformally disposed in side regions of the first channel hole and the second channel hole that communicate with each other, and the first channel layer 164 may be conformally disposed in side regions and bottom regions of the first channel hole and the second channel hole that communicate with each other, with the gate insulating layer 162 being disposed between the side regions and the first channel layer 164. The filling insulating layer 166 may fill (e.g., be disposed in) the remaining regions of the first channel hole and the second channel hole that communicate with each other and may be disposed on the channel layer 164. The conductive plug 168 may contact the channel layer 164 and block an entrance of the first channel hole and the second channel hole that communicate with each other. For example, the entrance may be a top end of the second channel hole that is disposed on upper sides of the first channel hole and the second channel hole that communicate with each other. In some embodiments, the filling insulating layer 166 may be omitted, and the channel layer 164 may be formed in a pillar shape that fills the first channel hole and the second channel hole that communicate with each other. For example, the channel layer 164 may be disposed in the first channel hole and the second channel hole that communicate with each other.

The plurality of channels 160 may penetrate the upper base layer 110U and the lower base layer 110L to contact the substrate layer 110S. In some embodiments, a channel layer 164 may contact the base substrate 110 in bottom regions of first channel holes and second channel holes that communicate with each other. For example, the bottom regions may be lower ends of the plurality of first channel holes 160H1. In some embodiments, a bottom surface of a channel layer 164 may be disposed at a lower vertical level than a top surface of the substrate layer 110S.

As shown in FIG. 4B, a portion of the gate insulating layer 162 may be omitted at a same level as the lower base layer 110L, and the channel layer 164 may contact an extension portion 110LE of the lower base layer 110L. A sidewall portion 162S and a bottom portion 162L of the gate insulating layer 162 are spaced apart from each other with the extension portion 110LE of the lower base layer 110L disposed therebetween, and the bottom portion 162L of the gate insulating layer 162 surrounds the bottom surface of the channel layer 164. Therefore, the channel layer 164 may not directly contact the substrate layer 110S but may be in contact with and electrically connect to the lower base layer 110L through the sidewall portion 162S and the bottom portion 162L of the gate insulating layer 162 that are spaced apart from each other.

As shown in FIG. 4B, the gate insulating layer 162 may be arranged as a structure that sequentially includes a tunneling dielectric layer 162A disposed on an outer wall of the channel layer 164, a charge storage layer 162B adjacent to the tunneling dielectric layer 162A, and a blocking dielectric layer 162C adjacent to the charge storage layer 162B. The relative thicknesses (e.g., in a horizontal direction) of the tunneling dielectric layer 162A, the charge storage layer 162B, and the blocking dielectric layer 162C that constitute the gate insulating layer 162 are not limited to those illustrated in FIG. 4B and may be modified in various ways.

The tunneling dielectric layer 162A may include silicon oxide, hafnium oxide, aluminum oxide, zirconium oxide, tantalum oxide, etc. The charge storage layer 162B is a region in which electrons that pass through the tunneling dielectric layer 162A from the channel layer 164 may be stored, and may include silicon nitride, boron nitride, silicon boron nitride, or polysilicon doped with impurities. The blocking dielectric layer 162C may include silicon oxide, silicon nitride, or metal oxide with a higher dielectric constant than that of silicon oxide. The metal oxide may include hafnium oxide, aluminum oxide, zirconium oxide, tantalum oxide, or a combination thereof.

As illustrated in FIG. 4A, the gate stack separation hole WLH may extend on the base substrate 110 in the first horizontal direction (X direction) parallel to the top surface of the base substrate 110. The gate stack separation hole WLH may penetrate the first gate stack GS1, the second gate stack GS2, and an upper insulating layer 174 disposed above the second gate stack GS2. In some embodiments, the substrate layer 110S may be at least partially exposed by the gate stack separation hole WLH. A region of the first gate stack GS1 and a region of the second gate stack GS2 disposed between a pair of gate stack separation holes WLH may constitute a block, and the pair of gate stack separation holes WLH may delimit widths of the region of the first gate stack GS1 and the region of the second gate stack GS2 in the second horizontal direction (Y direction).

In a block, an uppermost second gate line 230 may be separated into two portions by a string separation insulating layer. The two portions may constitute the string selection line SSL described with reference to FIG. 3.

A gate stack separation insulating layer 150 may at least partially fill (e.g., be at least partially disposed in) the gate stack separation hole WLH and may be disposed on the base substrate 110. The gate stack separation insulating layer 150 may include silicon oxide, silicon nitride, silicon oxynitride, or a low-κ material. For example, the gate stack separation insulating layer 150 may include a silicon oxide layer, a silicon nitride layer, SiON, SiOCN, SiCN, or a combination thereof.

A top support layer TS may be disposed on the upper insulating layer 174. The top support layer TS may include a hole TSH, and the hole TSH may vertically overlap the gate stack separation hole WLH. The top support layer TS may provide a structural stability to the first gate stack GS1 to prevent process defects caused by bending or leaning of the first gate stack GS1 during the manufacturing process of the integrated circuit device 100.

The upper filling layer 176 may at least partially fill (e.g., be at least partially disposed in) the hole TSH. In some embodiments, the upper filling layer 176 may include the same material as the gate stack separation insulating layer 150. Each of the top support layer TS and the upper filling layer 176 may include silicon oxide or silicon oxynitride.

A bit line contact BLC may penetrate the top support layer TS and the upper insulating layer 174 to contact the conductive plug 168 of the channels 160. A bit line BL may contact the bit line contact BLC and may extend on the top support layer TS in the second horizontal direction (Y direction). A plurality of conductive lines ML may be formed on the top support layer TS in the through electrode region TVR and the connection region CON. An additional insulating layer may be formed between the top support layer TS and the bit line BL and between the top support layer TS and the plurality of conductive lines ML.

The first gate stack GS1 may extend to constitute a first pad portion PAD1, and a first cover insulating layer 172 may at least partially cover the first pad portion PAD1 in the connection region CON. The second gate stack GS2 may extend to constitute a second pad portion PAD2, and a second cover insulating layer 272 may at least partially cover the second pad portion PAD2. In the connection region CON, the first gate lines 130 and the second gate lines 230 may extend to have shorter lengths in the first horizontal direction (X direction) and/or the second horizontal direction (Y direction) as moving away from the top surface of the base substrate 110, forming a stairs shape. For example, a bottommost first gate line 130 may extend for a certain length in the first and/or second horizontal directions, the next bottommost first gate line 130 may extend for a shorter length in the first and/or second horizontal directions than the bottommost first gate line 130, and so on. Likewise, a bottommost second gate line 230 may extend for a certain length in the first and/or second horizontal directions shorter than the uppermost first gate line 130, the next bottommost second gate line 230 may extend for a shorter length in the first and/or second horizontal directions than the bottommost second gate line 230, and so on. The first pad portion PAD1 may refer to portions of the first gate lines 130 disposed in a stairs shape, and the second pad portion PAD2 may refer to portions of the second gate lines 230 disposed in the stairs shape.

In the connection region CON, the plurality of pad contacts CNT may be arranged. A first group of pad contacts of the plurality of pad contacts CNT may penetrate the top support layer TS, the upper insulating layer 174, the second cover insulating layer 272, and the first cover insulating layer 172 and may be connected to the first gate lines 130. A second group of pad contacts of the plurality of pad contacts CNT may penetrate the top support layer TS, the upper insulating layer 174, and the second cover insulating layer 272 and may be connected to the second gate lines 230. Each of the first gate lines 130 and the second gate lines 230 may be referred to as a gate line, and the first cover insulating layer 172, the second cover insulating layer 272, the upper insulating layer 174, and the top support layer TS may be collectively referred to as a cover insulating layer. The plurality of pad contacts CNT may penetrate the cover insulating layer to connect the plurality of conductive lines ML and the gate lines. The first group of pad contacts may penetrate the cover insulating layer and the first base insulating layers 140 that covers top surfaces of the first gate lines 130. The second group of pad contacts may penetrate the cover insulating layer and the second base insulating layers 240 that cover top surfaces of the second gate lines 230.

In some embodiments, in the connection region CON, a common source contact CSLT may be disposed. The common source contact CSLT may penetrate the top support layer TS, the upper insulating layer 174, the second cover insulating layer 272, the first cover insulating layer 172, the upper base layer 110U, and the insulating plate 112 and may connect the plurality of conductive lines ML and the substrate layer 110S. In some embodiments, the common source contact CSLT may be disposed in the gate stack separation hole WLH. In this case, a common source region may be formed in a portion of the substrate layer 110S that contacts the common source contact CSLT. The common source region may be an impurity region heavily doped with n-type impurities, and may function as a source region supplying current to memory cells.

A plurality of dummy channels that penetrate the first gate stack GS1 and the second gate stack GS2 from the top surface of the substrate layer 110S and extend in the vertical direction (Z direction) may be formed in the connection region CON. The plurality of dummy channels may be formed to prevent leaning or bending of the first gate stack GS1 and the second gate stack GS2 during the manufacturing process of the integrated circuit device 100 and to secure a structural stability. Each dummy channel of the plurality of dummy channels may have a similar structure and shape to each channel of the plurality of channels 160. The upper insulating layer 174 may be disposed on the second gate stack GS2 and the second cover insulating layer 272.

The plurality of through electrodes TVS may at least partially fill (e.g., be at least partially disposed in) a plurality of electrode holes TVH and may be arranged in the through electrode region TVR. The plurality of electrode holes TVH may penetrate the top support layer TS, the second cover insulating layer 272, the first cover insulating layer 172, and the base insulating layer 120 to at least partially expose the peripheral wiring circuit 70. The plurality of through electrodes TVS may penetrate the top support layer TS, the second cover insulating layer 272, the first cover insulating layer 172, and the base insulating layer 120 to connect to the peripheral wiring circuit 70. In some embodiments, lower surfaces of the plurality of through electrodes TVS may contact an uppermost peripheral circuit wiring layer of the plurality of peripheral circuit wiring layers 74. The plurality of through electrodes TVS may connect the plurality of conductive lines ML and the peripheral wiring circuit 70.

Although it is illustrated in FIG. 4A that the memory cell region MCR is disposed between the through electrode region TVR and the connection region CON, embodiments of the inventive concept are not necessarily limited thereto. For example, in some embodiments, the through electrode region TVR may be disposed between the memory cell region MCR and the connection region CON. Furthermore, in some embodiments, the through electrode region TVR may be disposed in the connection region CON. For example, the through electrode region TVR may be disposed between the first pad portion PAD1 and the second pad portion PAD2 in the connection region CON.

The barrier layer 90 acts as a structural support layer during the manufacturing process of the integrated circuit device 100, and therefore the integrated circuit device 100 according to the inventive concept has an increased structural reliability.

FIGS. 5A to 6C are plan views of through electrode regions TVR-1a, TVR-1b, TVR-1c, TVR-2a, TVR-2b, and TVR-2c of integrated circuit devices 100-1a, 100-1b, 100-1c, 100-2a, 100-2b, and 100-2c according to embodiments of the inventive concept. Through electrode regions TVR-1a, TVR-1b, TVR-1c, TVR-2a, TVR-2b, and TVR-2c are examples of, or include aspects of, through electrode region TVR described with reference to FIG. 4A. Integrated circuit devices 100-1a, 100-1b, 100-1c, 100-2a, 100-2b, and 100-2c are examples of, or include aspects of, integrated circuit device 10 described with reference to FIG. 1 and/or integrated circuit device 100 described with reference to FIG. 4A. Specifically, FIGS. 5A to 6C are plan views of the first barrier layer 92 described with reference to FIG. 4A cut in a horizontal direction (X direction and Y direction) in a region corresponding to the through electrode region TVR shown in FIG. 4A. Redundant descriptions of similar elements illustrated by FIGS. 5A to 6C and FIGS. 4A to 4C may be omitted.

Figure 5A:
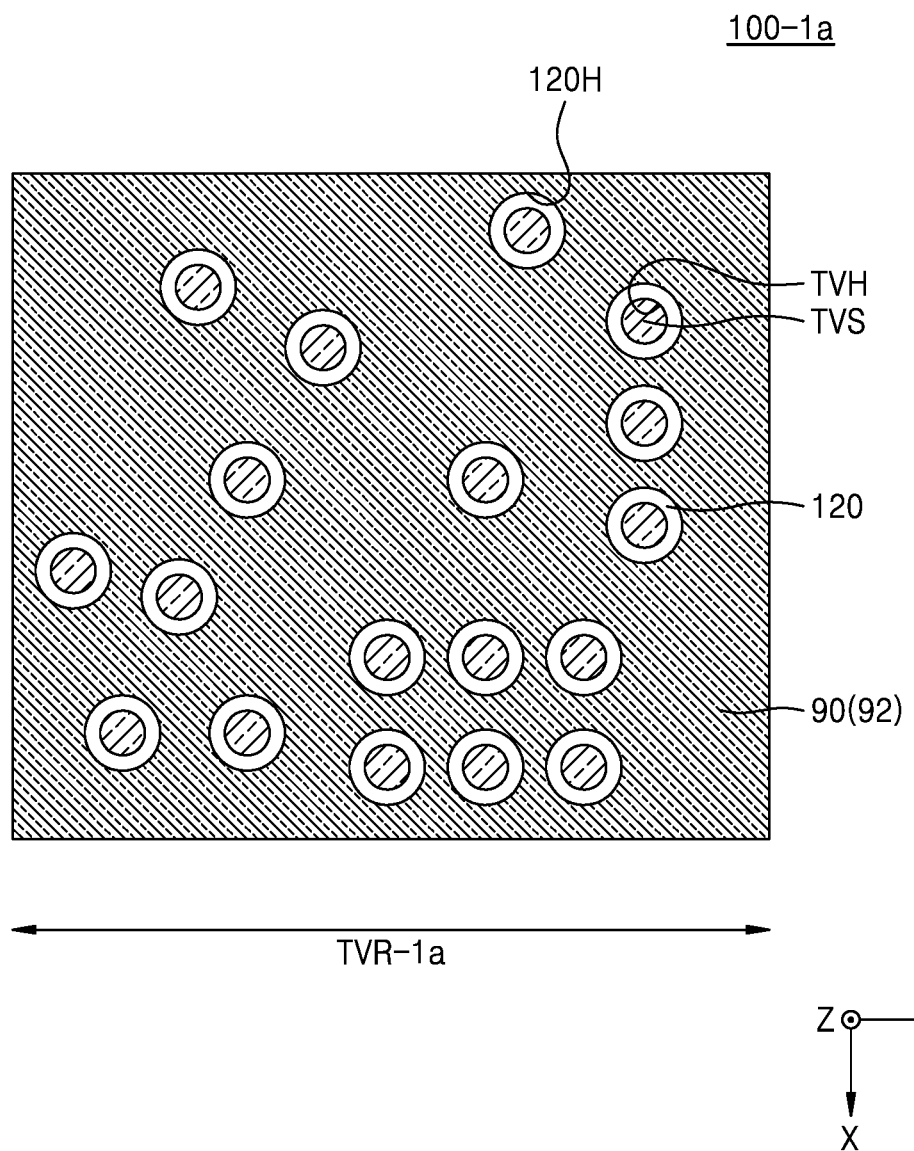
FIGS. 5A to 6C are plan views of through electrode regions of the integrated circuit device of FIG. 4A.

Referring to FIG. 5A, the integrated circuit device 100-1a may include the through electrode region TVR-1a in which the plurality of through electrodes TVS that fills (e.g., is disposed in) the plurality of electrode holes TVH are arranged. The plurality of holes 120H may penetrate the barrier layer 90 including the first barrier layer 92. The base insulating layer 120 may fill (e.g., be disposed in) the plurality of holes 120H. The plurality of electrode holes TVH may penetrate the base insulating layer 120 that fills (e.g., is disposed in) the plurality of holes 120H.

The plurality of through electrodes TVS may fill (e.g., be disposed in) the plurality of electrode holes TVH. Each through electrode of the plurality of through electrodes TVS may include the base insulating layer 120 filled in (e.g., disposed in) each of the plurality of holes 120H therebetween, and may be spaced apart from the barrier layer 90 that includes the first barrier layer 92. For example, each through electrode of the plurality of through electrodes TVS may be at least partially surrounded by the base insulating layer 120, and the plurality of through electrodes TVS may be spaced apart from the barrier layer 90 by the base insulating layer 120.

In some embodiments, each hole of the plurality of holes 120H may have a circular cross-section in the horizontal directions (i.e., the X direction and the Y direction). For example, each hole of the plurality of holes 120H may at least partially surround a corresponding through electrode of the plurality of through electrodes TVS. The base insulating layer 120 that fills (e.g., is disposed in) the plurality of holes 120H may have a ring-shaped cross section in the horizontal directions (i.e., the X direction and the Y direction).

Figure 5B:
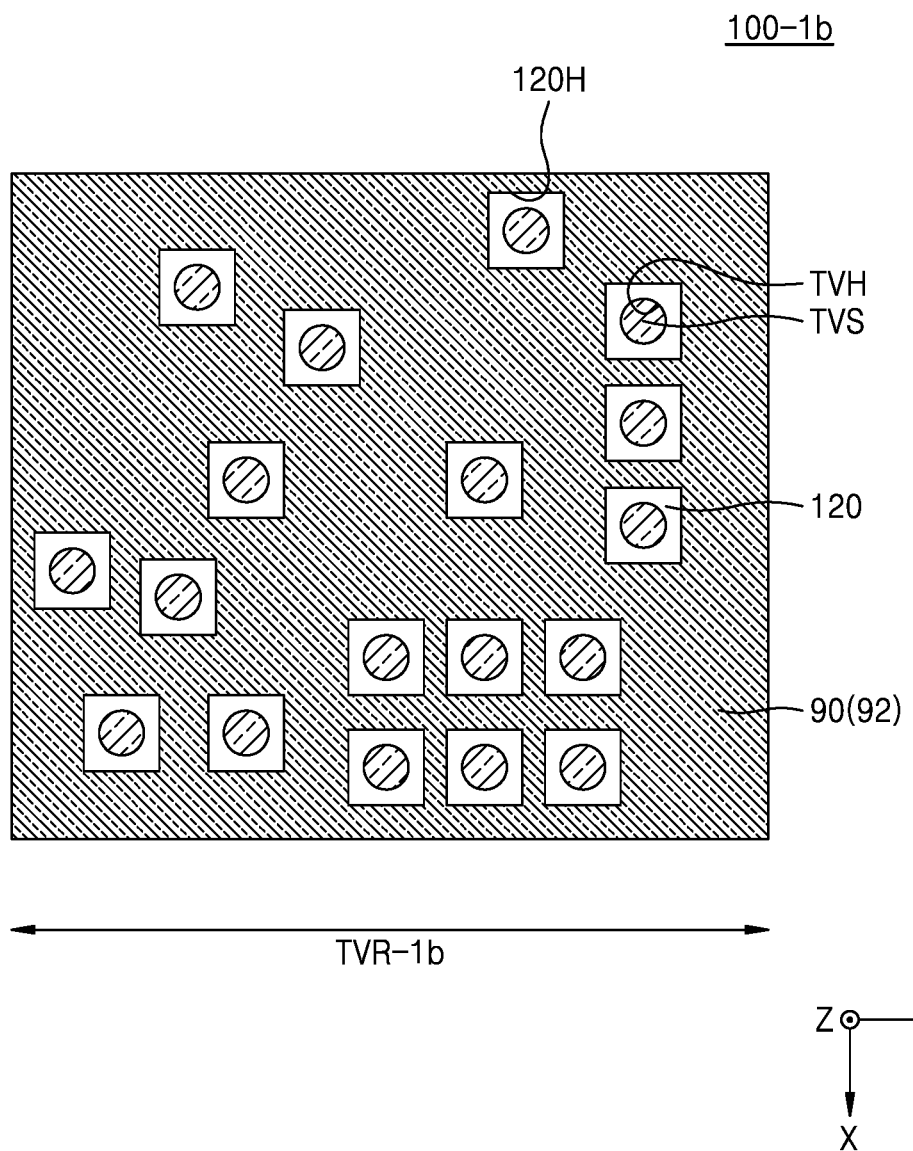

Referring to FIG. 5B, the integrated circuit device 100-1b may include the through electrode region TVR-1b in which the plurality of through electrodes TVS that fills (e.g., is disposed in) the plurality of electrode holes TVH are arranged.

In some embodiments, each hole of the plurality of holes 120H may have a rectangular cross-section in the horizontal directions (i.e., the X direction and the Y direction). In some embodiments, each hole of the plurality of holes 120H may at least partially surround a corresponding through electrode of the plurality of through electrodes TVS.

Figure 5C:
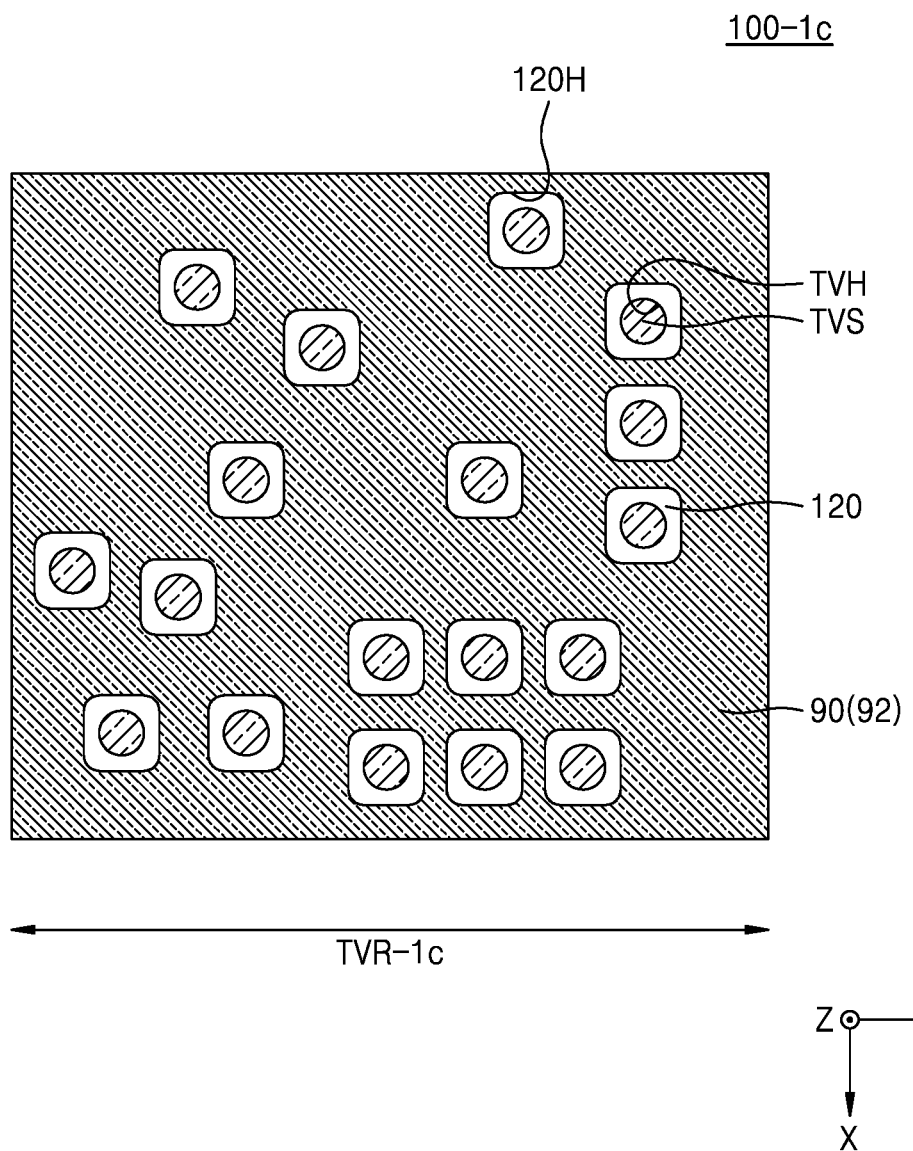

Referring to FIG. 5C, the integrated circuit device 100-1c may include the through electrode region TVR-1c in which the plurality of through electrodes TVS that fills (e.g., is disposed in) the plurality of electrode holes TVH are arranged.

In some embodiments, each hole of the plurality of holes 120H may have a rectangular cross-section with round corners in the horizontal directions (i.e., the X direction and the Y direction). For example, each hole of the plurality of holes 120H may at least partially surround corresponding one of the plurality of through electrodes TVS.

Figure 6A:
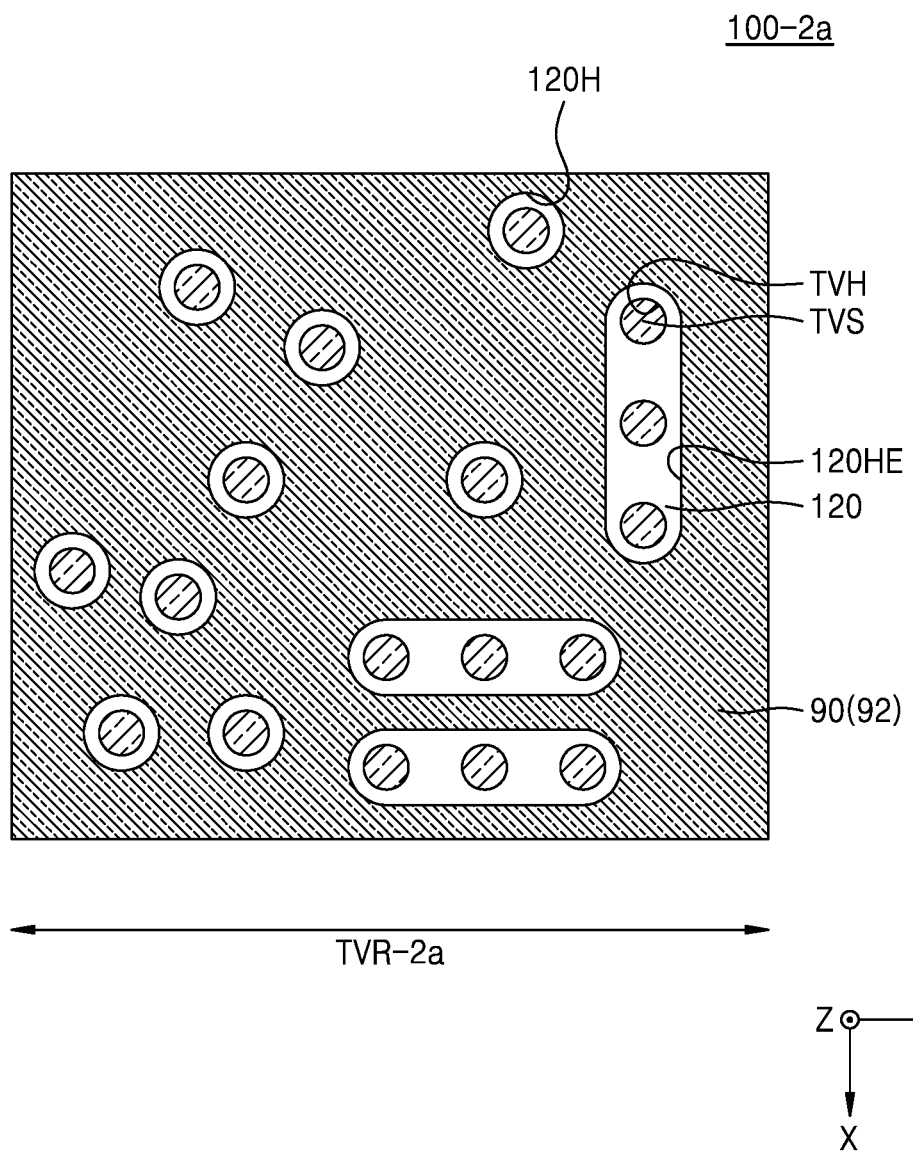

Referring to FIG. 6A, the integrated circuit device 100-2a may include the through electrode region TVR-2a in which the plurality of through electrodes TVS that fills (e.g., is disposed in) the plurality of electrode holes TVH are arranged. The plurality of holes 120H and at least one expansion hole 120HE may penetrate the barrier layer 90 that includes the first barrier layer 92. The base insulating layer 120 may fill (e.g., be disposed in) the plurality of holes 120H and the expansion hole 120HE. Each electrode hole of the plurality of electrode holes TVH may penetrate the base insulating layer 120 that fills (e.g., is disposed in) the plurality of holes 120H and the at least one expansion hole 120HE. In the present disclosure, a hole of the plurality of holes 120H may be referred to as a single hole, and, in this case, the plurality of holes 120H and the at least one expansion hole 120HE may be collectively referred to as a plurality of holes.

The plurality of through electrodes TVS may fill (e.g., be disposed in) the plurality of electrode holes TVH. Each through electrode of the plurality of through electrodes TVS may include the base insulating layer 120 that fills (e.g., is disposed in) the plurality of holes 120H and the at least one expansion hole 120HE therebetween, and may be spaced apart from the barrier layer 90 that includes the first barrier layer 92. For example, each through electrode of the plurality of through electrodes TVS may be at least partially surrounded by the base insulating layer 120, and the plurality of through electrodes TVS may be spaced apart from the barrier layer 90 by the base insulating layer 120.

In some embodiments, each hole of the plurality of holes 120H may have a circular cross-section in the horizontal directions (i.e., the X direction and the Y direction). For example, each hole of the plurality of holes 120H may at least partially surround a corresponding through electrode of the plurality of through electrodes TVS. The base insulating layer 120 that fills (e.g., is disposed in) the plurality of holes 120H may have a ring-shaped cross section in the horizontal directions (i.e., the X direction and the Y direction).

The at least one expansion hole 120HE may be connected to two or more holes of the plurality of holes 120H and may have an elliptical shape in the horizontal directions (i.e., the X direction and the Y direction). In some embodiments, the at least one expansion hole 120HE may have an elliptical shape that extends in any one of the first horizontal direction (the X direction), the second horizontal direction (the Y direction), and a third direction (e.g., a diagonal direction that is coplanar with and intersects the X direction and the Y direction). The at least one expansion hole 120HE may at least partially surround two or more through electrodes of the plurality of through electrodes TVS.

Among the plurality of through electrodes TVS, a through electrode that is spaced relatively far apart from other through electrodes may be disposed alone in a hole of the plurality of holes 120H. Among the plurality of through electrodes TVS, two or more through electrodes that are spaced relatively close to each other may be arranged together in an expansion hole 120HE. That is, a separation distance between a through electrode of the plurality of through electrode TVS disposed in a hole of the plurality of holes 120H and other through electrodes among the plurality of through electrodes TVS may be greater than a separation distance between two or more through electrodes of the plurality of through electrodes TVS arranged together in an expansion hole 120HE.

Figure 6B:
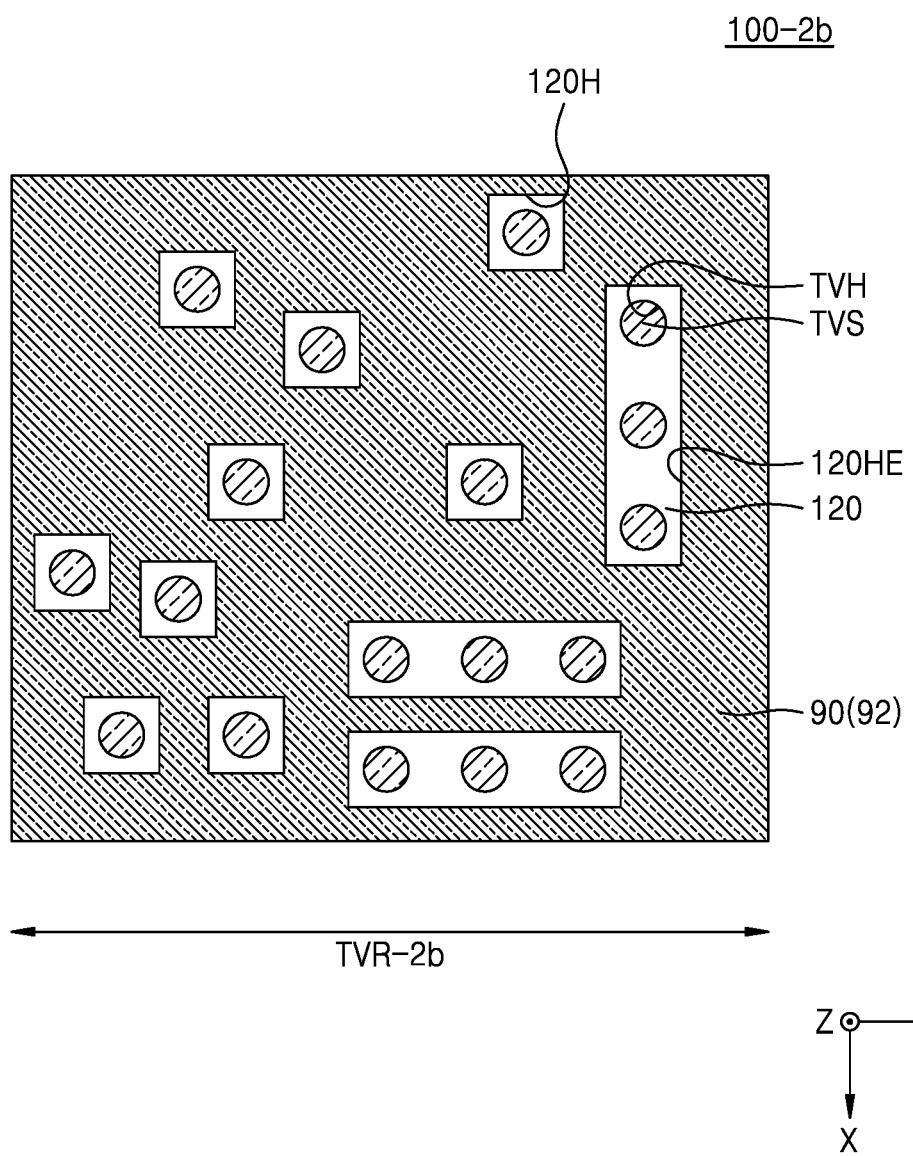

Referring to FIG. 6B, the integrated circuit device 100-2b may include the through electrode region TVR-2b in which the plurality of through electrodes TVS that fills (e.g., is disposed in) the plurality of electrode holes TVH are arranged.

In some embodiments, each hole of the plurality of holes 120H may have a rectangular cross-section in the horizontal directions (i.e., the X direction and the Y direction). For example, each hole of the plurality of holes 120H may at least partially surround a corresponding through electrode of the plurality of through electrodes TVS.

The at least one expansion hole 120HE may be connected to two or more holes of the plurality of holes 120H and may have a rectangular shape in the horizontal directions (i.e., the X direction and the Y direction). In some embodiments, the at least one expansion hole 120HE may have a rectangular shape that extends in any one of the first horizontal direction (the X direction), the second horizontal direction (the Y direction), and a third direction (e.g., a diagonal direction that is coplanar with and intersects the X direction and the Y direction). The expansion hole 120HE may at least partially surround two or more through electrodes of the plurality of through electrodes TVS.

Figure 6C:
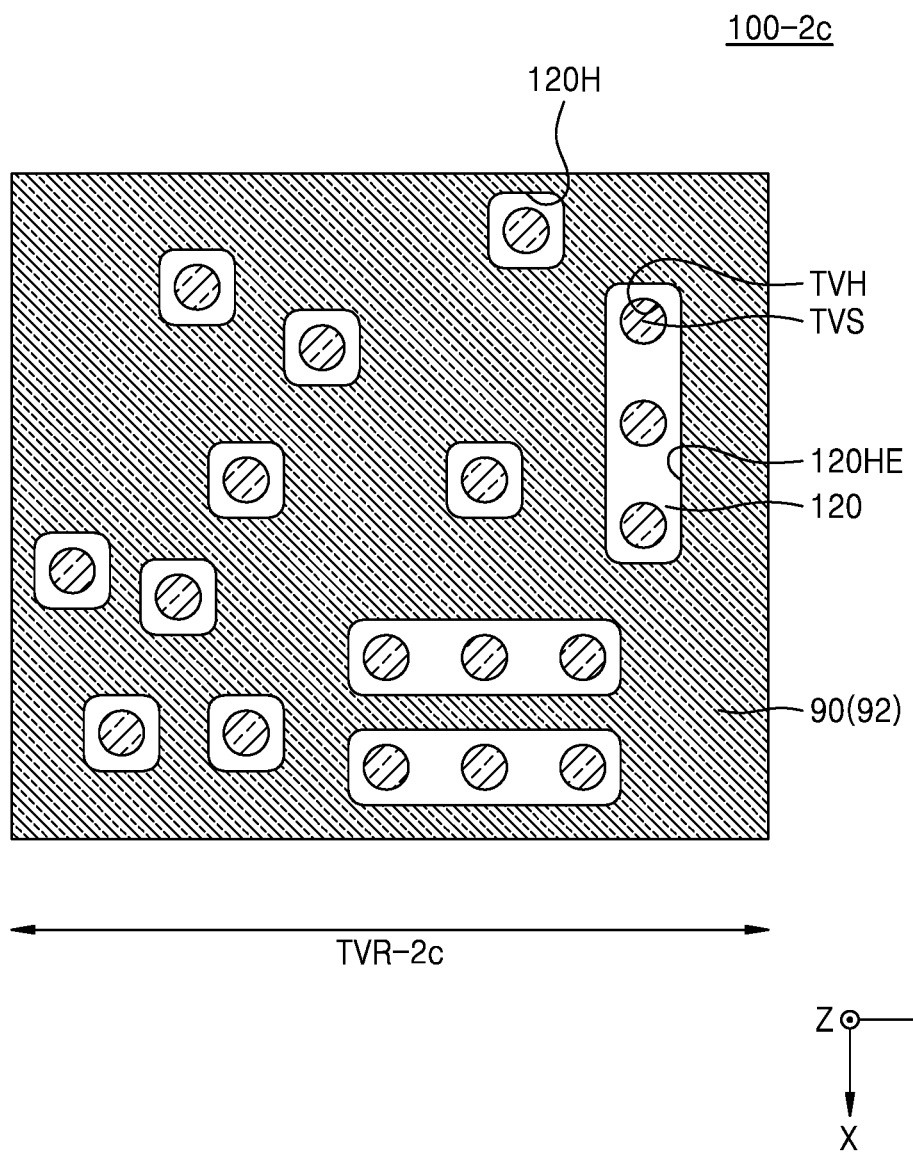

Referring to FIG. 6C, the integrated circuit device 100-2c may include the through electrode region TVR-2c in which the plurality of through electrodes TVS that fills (e.g., is disposed in) the plurality of electrode holes TVH are arranged.

In some embodiments, each hole of the plurality of holes 120H may have a rectangular cross-section with round corners in the horizontal directions (i.e., the X direction and the Y direction). For example, each hole of the plurality of holes 120H may surround a corresponding through hole of the plurality of through electrodes TVS.

The at least one expansion hole 120HE may be connected to two or more holes of the plurality of holes 120H and may have a rectangular shape with round corners in the horizontal directions (i.e., the X direction and the Y direction). In some embodiments, the at least one expansion hole 120HE may have a rectangular shape with round corners that extends in any one of the first horizontal direction (the X direction), the second horizontal direction (the Y direction), and a third direction (e.g., a diagonal direction that is coplanar with and intersects the X direction and the Y direction). The expansion hole 120HE may at least partially surround two or more through holes of the plurality of through electrodes TVS.

In FIG. 4A, only two through electrodes TVS are shown in the through electrode region TVR, but the through electrode region TVR shown in FIG. 4A may include any one of the through electrode regions TVR-1a, TVR-1b, TVR-1c, TVR-2a, TVR-2b, and TVR-2c shown in FIGS. 5A to 6C.

Figure 7A:
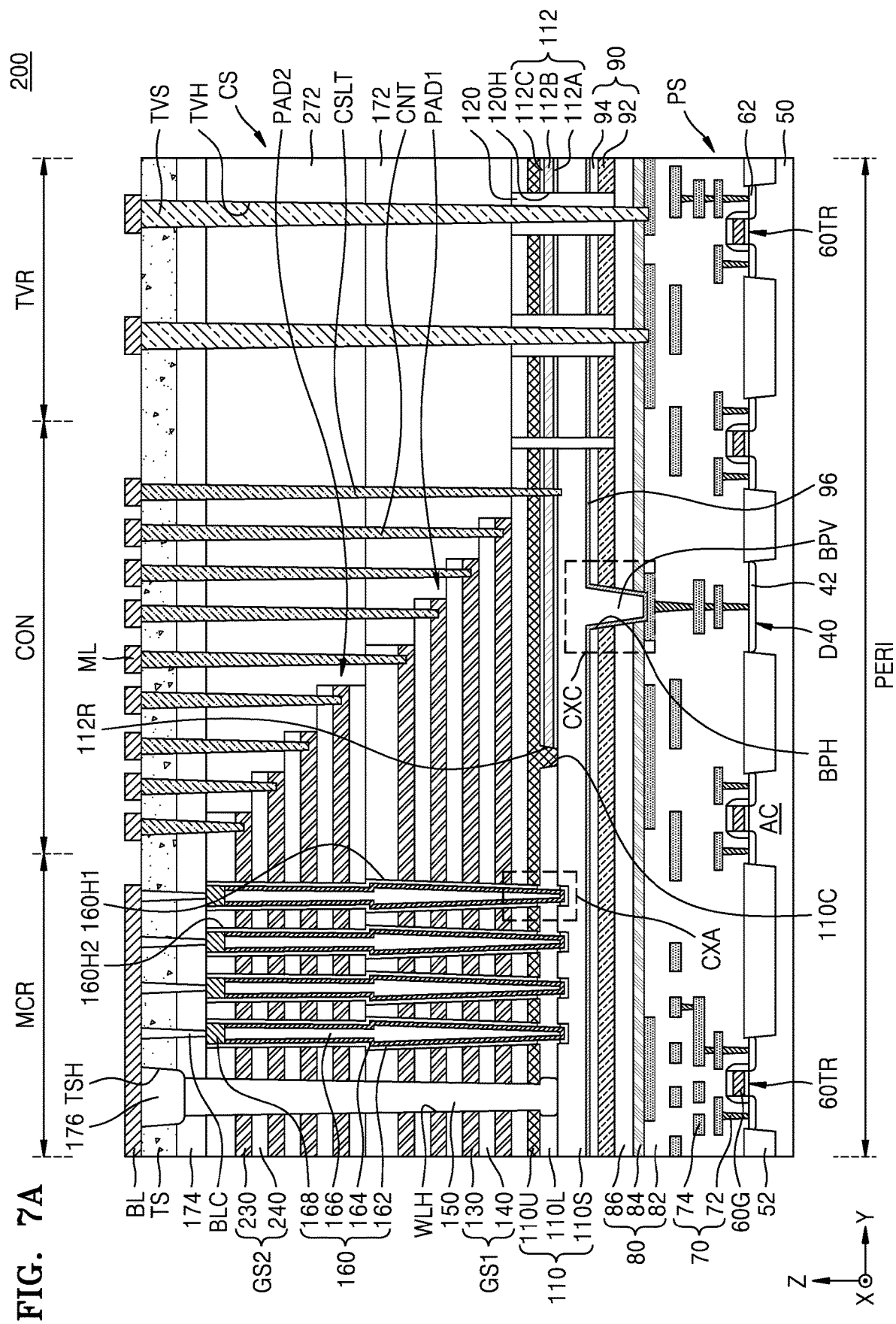
FIGS. 7A and 7B are cross-sectional views of an integrated circuit device according to embodiments of the inventive concept.
Figure 7B:
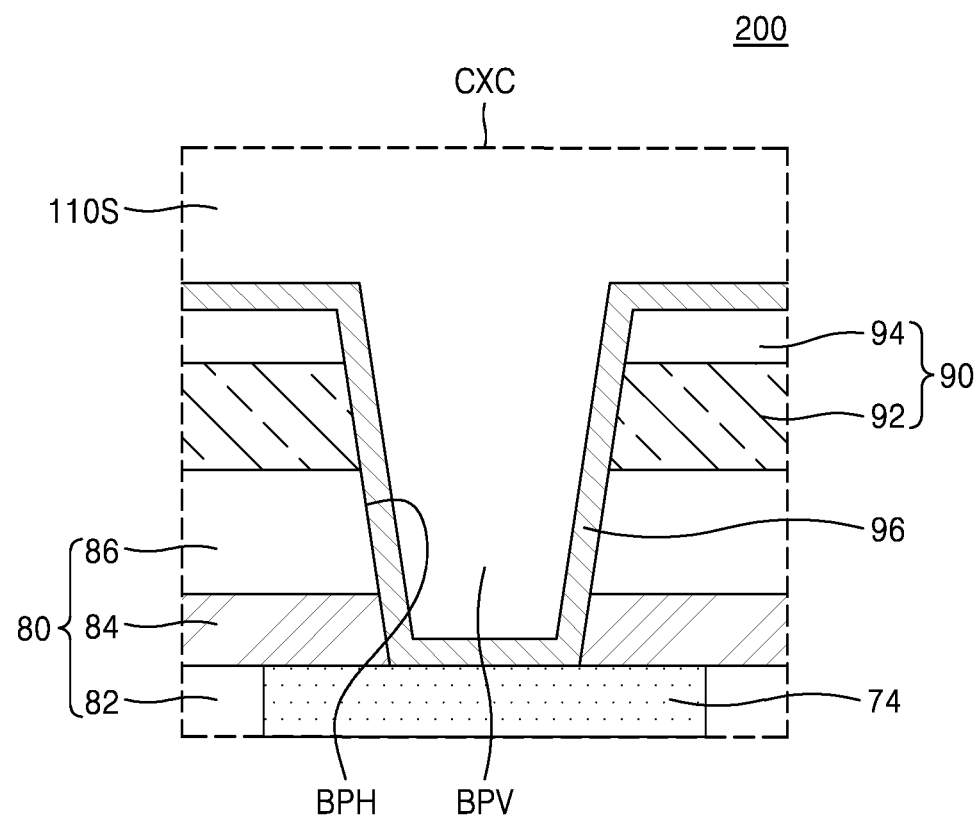

FIGS. 7A and 7B are cross-sectional views of an integrated circuit device 200 according to embodiments of the inventive concept. Specifically, FIG. 7B is an enlarged cross-sectional view of a portion CXC of FIG. 7A. Integrated circuit device 200 is an example of, or includes aspects of, the integrated circuit device 100 described with reference to FIG. 4A. Redundant descriptions of similar elements illustrated by FIGS. 7A and 7B and FIGS. 4A to 4C may be omitted.

Referring to FIGS. 7A and 7B together, the integrated circuit device 200 may include the peripheral circuit PS and the memory cell array CS disposed at a vertical level higher than the peripheral circuit PS (i.e., the memory cell array CS disposed above the peripheral circuit PS). The memory cell array CS may include the memory cell region MCR, the connection region CON, and the through electrode region TVR, and the peripheral circuit PS may include the peripheral circuit region PERI.

The peripheral circuit PS may include the peripheral circuit transistor 60TR and the peripheral wiring circuit 70 arranged on the substrate 50. The peripheral wiring circuit 70 includes the plurality of peripheral circuit contacts 72 and the plurality of peripheral circuit wiring layers 74. The interlayer insulating layer 80 may cover the peripheral circuit transistor 60TR and the peripheral wiring circuit 70 and may be arranged on the substrate 50. The at least one antenna diode D40 may be disposed on the substrate 50. The antenna diode D40 may include the diode ion injection region 42.

The interlayer insulating layer 80 may include the first interlayer insulating layer 82, the passivation layer 84, and the second interlayer insulating layer 86 that are sequentially stacked. The barrier layer 90 may be disposed on the interlayer insulating layer 80. In some embodiments, the barrier layer 90 may include a stacked structure in which the first barrier layer 92 covers the interlayer insulating layer 80 and the second barrier layer 94 covers the first barrier layer 92. The bypass hole BPH may penetrate the barrier layer 90 and a portion of the interlayer insulating layer 80. At least a portion of a peripheral circuit wiring layer of the plurality of peripheral circuit wiring layers 74 of the peripheral wiring circuit 70 may be at least partially exposed by the bypass hole BPH.

A cover layer 96 may extend from between the bypass via BPV and the first barrier layer 92 to a top surface of the second barrier layer 94. Specifically, the cover layer 96 may cover a top surface of the barrier layer 90, that is, a top surface of the second barrier layer 94, and may be disposed between the bypass via BPV, the second barrier layer 94, the first barrier layer 92, the second interlayer insulating layer 86, the passivation layer 84, and the plurality of circuit wiring layers 74. The cover layer 96 may conformally cover the top surface of the second barrier layer 94 and the outer surface of the bypass via BPV. In the bypass hole BPH, the cover layer 96 may cover side surfaces of the second barrier layer 94, side surfaces of the first barrier layer 92, side surfaces of the second interlayer insulating layer 86, side surfaces of the passivation layer 84, and a top surface of a peripheral circuit wiring layer of the plurality of peripheral circuit wiring layers 74. In some embodiments, the cover layer 96 may include a nitride including a metal, or a metal silicide. For example, the cover layer 96 may include TiN (titanium nitride), Ti—Si—N (TSN), WN (tungsten nitride), or WSi.

The base substrate 110 may be disposed on the cover layer 96. The bypass via BPV may be disposed in the bypass hole BPH. In some embodiments, the bypass via BPV may be integrally formed with the substrate layer 110S. The cover layer 96 may include a material different from a material included in the substrate layer 110S. In some embodiments, the cover layer 96 may include a material resistant to etching of the substrate layer 110S. The cover layer 96 may prevent the first barrier layer 92 from being removed when a portion of the substrate layer 110S is removed during a manufacturing process.

Figure 8A:
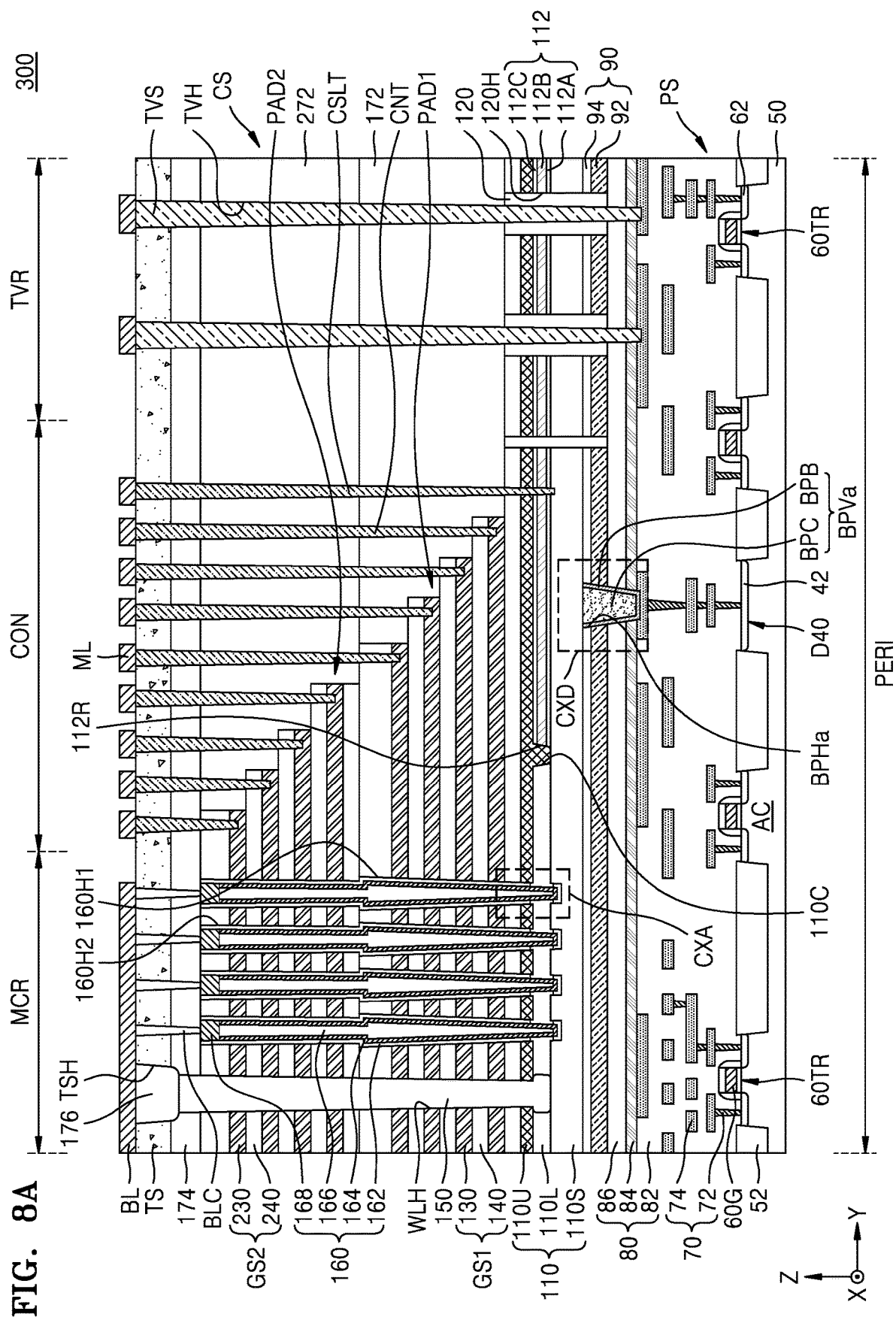
FIGS. 8A and 8B are cross-sectional views of an integrated circuit device according to embodiments of the inventive concept.
Figure 8B:
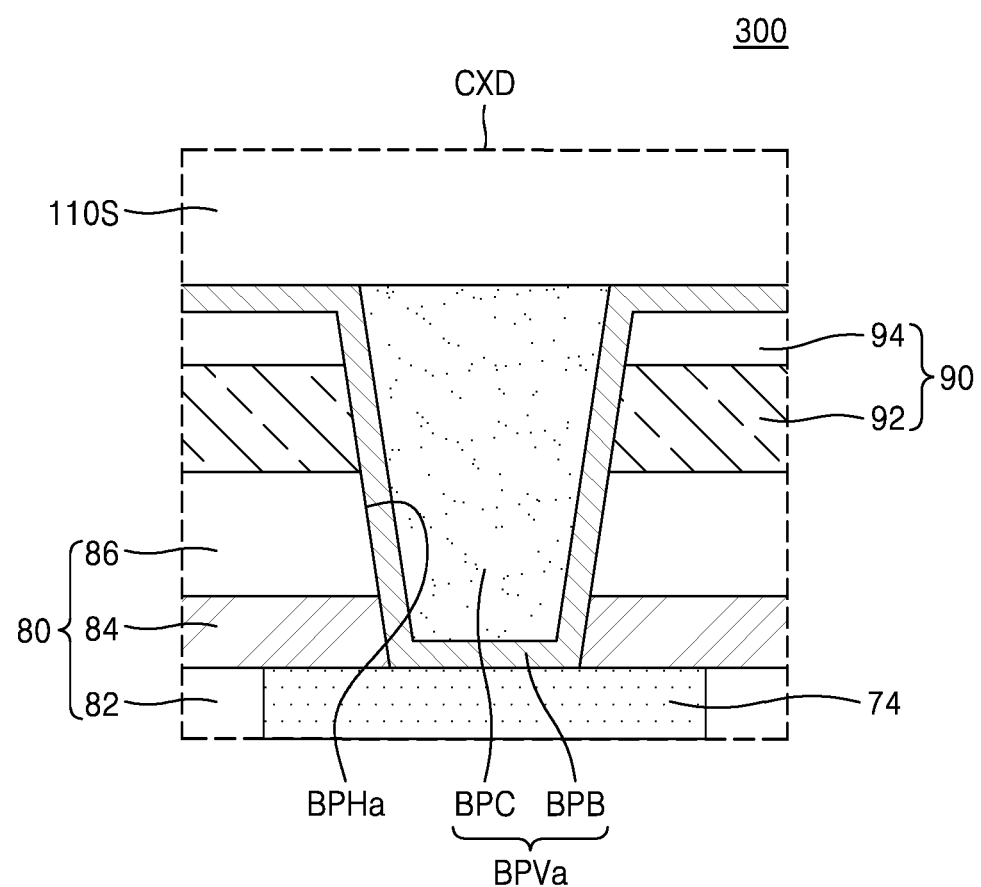

FIGS. 8A and 8B are cross-sectional views of an integrated circuit device 300 according to embodiments of the inventive concept. Specifically, FIG. 8B is an enlarged cross-sectional view of a portion CXD of FIG. 8A. Integrated circuit device 300 is an example of, or includes aspects of, the integrated circuit device 100 described with reference to FIG. 4A and/or the integrated circuit device 200 described with reference to FIG. 7A. Redundant descriptions of similar elements illustrated by FIGS. 8A and 8B, FIGS. 4A to 4C, and FIGS. 7A and 7B may be omitted below.

Referring to FIGS. 8A and 8B together, the integrated circuit device 300 may include the peripheral circuit PS and the memory cell array CS disposed at a vertical level higher than the peripheral circuit PS (i.e., the memory cell array CS disposed above the peripheral circuit PS). The memory cell array CS may include the memory cell region MCR, the connection region CON, and the through electrode region TVR, and the peripheral circuit PS may include the peripheral circuit region PERI.

The peripheral circuit PS may include the peripheral circuit transistor 60TR and the peripheral wiring circuit 70 arranged on the substrate 50. The peripheral wiring circuit 70 includes the plurality of peripheral circuit contacts 72 and the plurality of peripheral circuit wiring layers 74. The interlayer insulating layer 80 may cover the peripheral circuit transistor 60TR and the peripheral wiring circuit 70 and may be arranged on the substrate 50. The at least one antenna diode D40 may be disposed on the substrate 50. The antenna diode D40 may include the diode ion injection region 42.

The interlayer insulating layer 80 may include the first interlayer insulating layer 82, the passivation layer 84, and the second interlayer insulating layer 86 that are sequentially stacked. The barrier layer 90 may be disposed on the interlayer insulating layer 80. In some embodiments, the barrier layer 90 may include a stacked structure in which the first barrier layer 92 covers the interlayer insulating layer 80 and the second barrier layer 94 covers the first barrier layer 92. The bypass hole BPHa may penetrate the barrier layer 90 and a portion of the interlayer insulating layer 80. At least a portion of a peripheral circuit wiring layer of the plurality of peripheral circuit wiring layers 74 of the peripheral wiring circuit 70 may be exposed by the bypass hole BPHa.

A bypass via BPVa may be disposed in the bypass hole BPHa. The bypass via BPVa may include a bypass conductive layer BPC and a bypass barrier layer BPB that conformally covers at least a portion of the bypass conductive layer BPC. The bypass barrier layer BPB may include a metal nitride. For example, the bypass barrier layer BPB may include TiN or WN. The bypass conductive layer BPC may include a metal. For example, the bypass conductive layer BPC may include W (tungsten), etc.

The base substrate 110 may be disposed on the barrier layer 90 and the bypass via BPVa. The second barrier layer 94 and the bypass via BPVa may include a material different from a material included in the substrate layer 110S. In some embodiments, the second barrier layer 94 and the bypass via BPVa may include a material resistant to etching of the substrate layer 110S. The second barrier layer 94 and the bypass via BPVa are filled in (e.g., disposed in) the bypass hole BPHa through which the first barrier layer 92 is exposed, thereby preventing the first barrier layer 92 from being removed when a portion of the substrate layer 110S is removed during a manufacturing process.

Figure 9A:
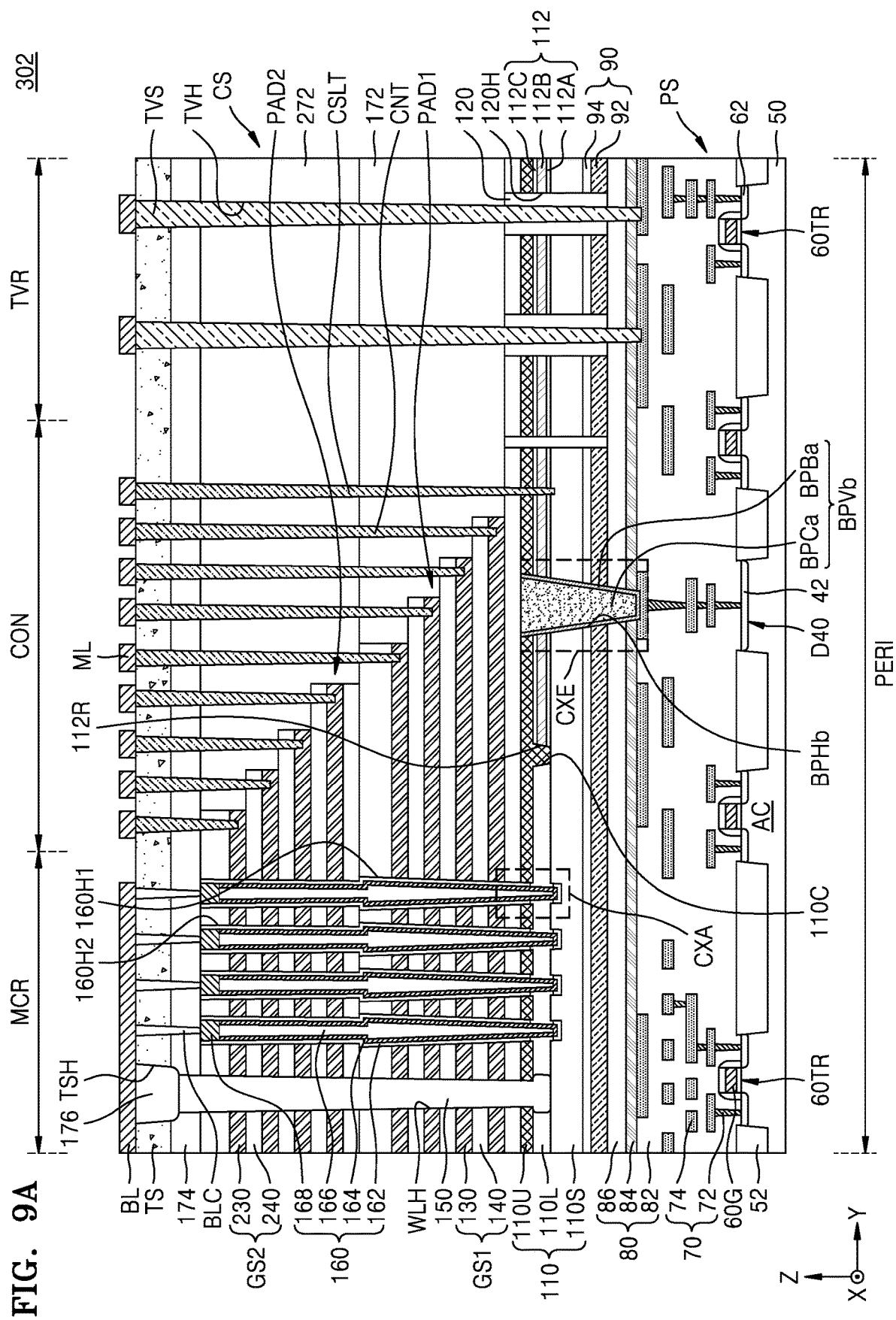
FIGS. 9A and 9B are cross-sectional views of an integrated circuit device according to embodiments of the inventive concept.
Figure 9B:
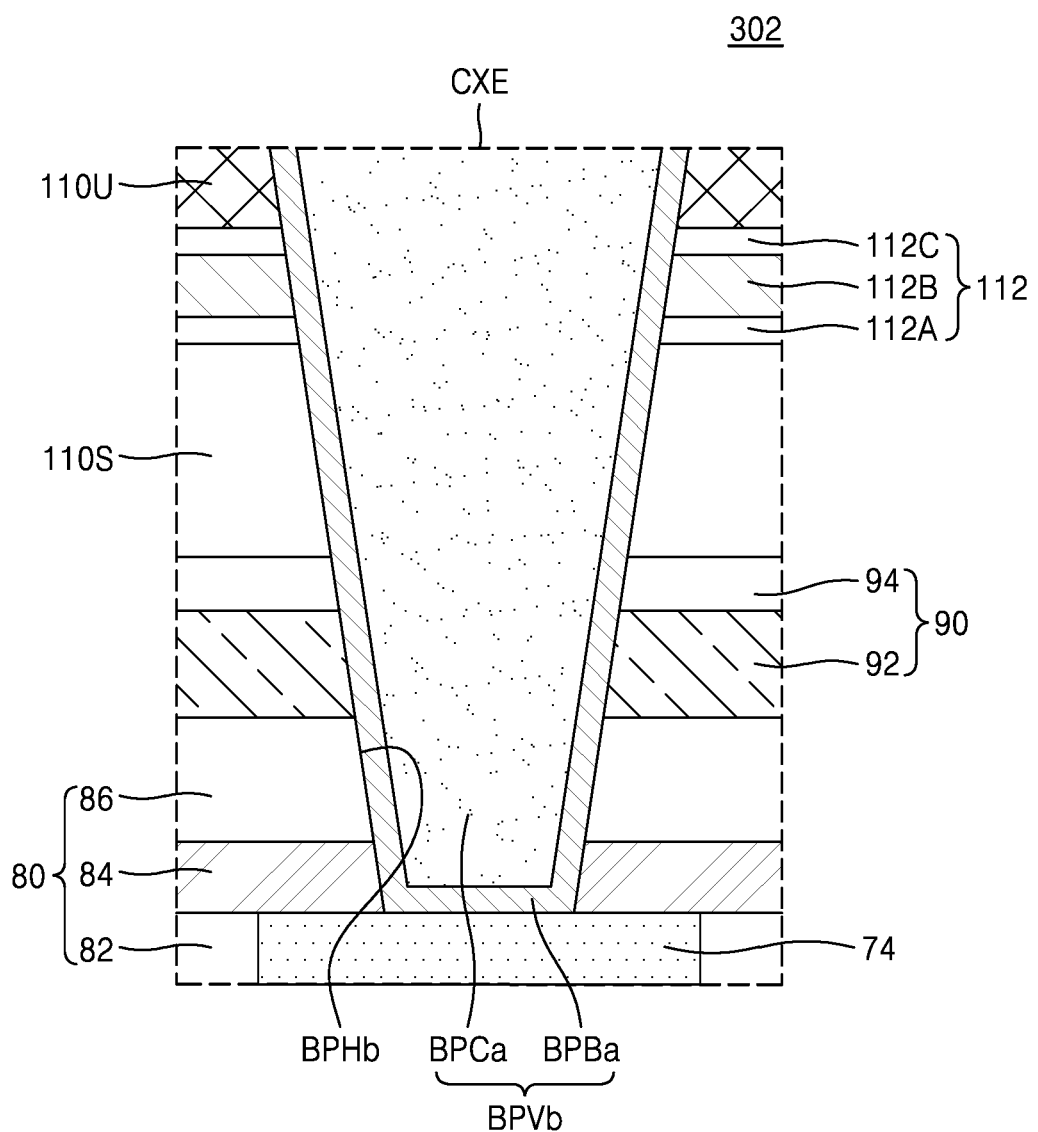

FIGS. 9A and 9B are cross-sectional views of an integrated circuit device 302 according to embodiments of the inventive concept. Specifically, FIG. 9B is an enlarged cross-sectional view of a portion CXE of FIG. 9A. Integrated circuit device 302 is an example of, or includes aspects of, the integrated circuit device 100 described with reference to FIG. 4A and/or the integrated circuit device 300 described with reference to FIG. 8A. Redundant descriptions of similar elements illustrated by FIGS. 9A and 9B, FIGS. 4A to 4C, and FIGS. 8A and 8B may be omitted.

Referring to FIGS. 9A and 9B together, the integrated circuit device 302 may include the peripheral circuit PS and the memory cell array CS disposed at a vertical level higher than the peripheral circuit PS (i.e., the memory cell array CS disposed above the peripheral circuit PS).

A bypass hole BPHb may penetrate the base substrate 110 and the barrier layer 90, and a portion of the interlayer insulating layer 80. At least a portion of a peripheral wiring layer of the plurality of peripheral circuit wiring layers 74 of the peripheral wiring circuit 70 may be exposed by the bypass hole BPHb.

A bypass via BPVb may be disposed in the bypass hole BPHb. The bypass via BPVb may include a bypass conductive layer BPCa and a bypass barrier layer BPBa that conformally covers at least a portion of the bypass conductive layer BPCa. The bypass barrier layer BPBa may include a metal nitride. The bypass conductive layer BPCa may include a metal.

A top surface of the bypass via BPVa shown in FIGS. 8A and 8B may be positioned above a top surface of the barrier layer 90 to be coplanar with each other, while a top surface of the bypass via BPVb shown in FIGS. 9A and 9B may be positioned at a same vertical level as that of a top surface of the base substrate 110 to be coplanar with each other.

FIGS. 10A to 10F are cross-sectional views that illustrate a process of manufacturing an integrated circuit device according to embodiments of the inventive concept. Specifically, FIGS. 10A to 10F are cross-sectional views that illustrate the process of manufacturing the integrated circuit device 100 shown in FIGS. 4A to 4C, and redundant descriptions of similar elements illustrated by FIGS. 10A to 10F and FIGS. 4A to 4C may be omitted.

Figure 10A:
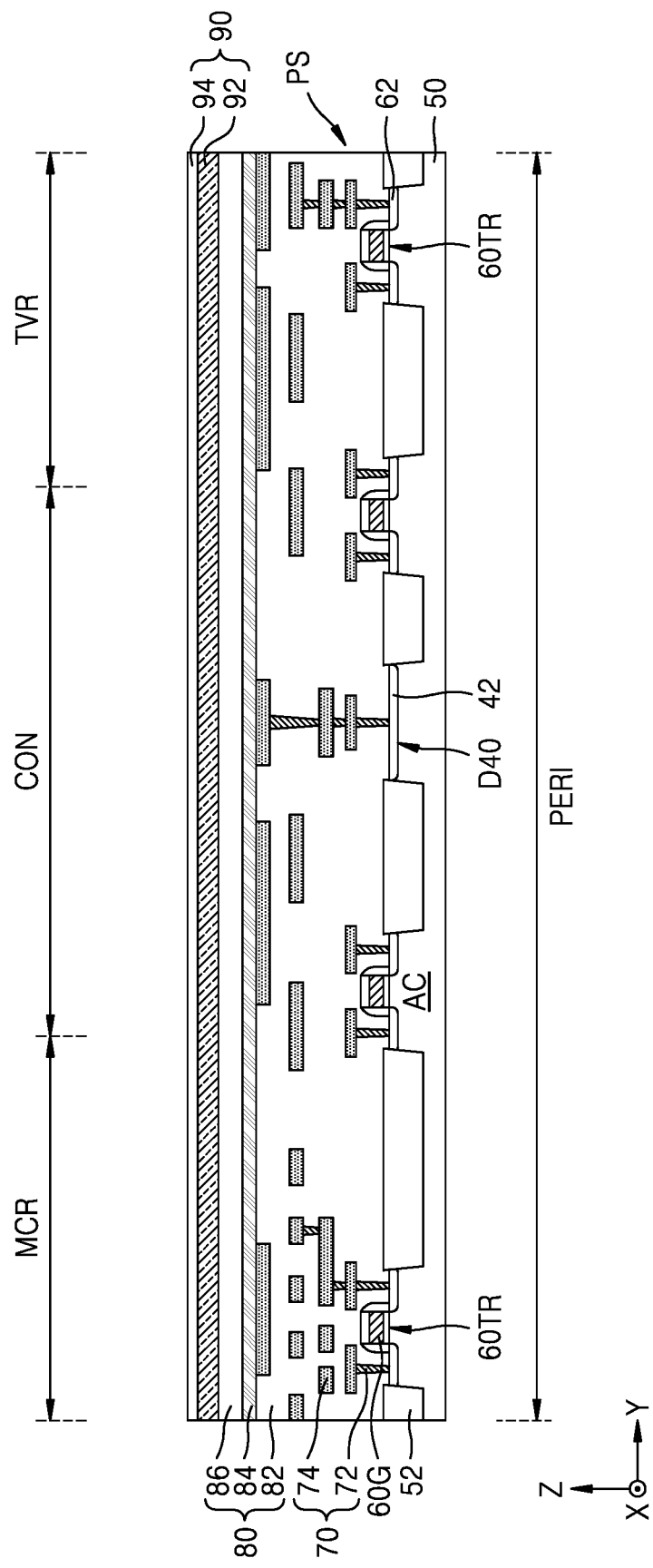
FIGS. 10A to 10F are cross-sectional views that illustrate a process of manufacturing the integrated circuit device of FIG. 4A.

Referring to FIG. 10A, the peripheral circuit PS that includes the peripheral wiring circuit 70 surrounded by the peripheral circuit transistor 60TR disposed on the substrate 50 and the interlayer insulating layer 80 is formed.

The barrier layer 90 is formed on the interlayer insulating layer 80. The barrier layer 90 may be formed to include a stacked structure in which the first barrier layer 92 covers the interlayer insulating layer 80 and the second barrier layer 94 covers the first barrier layer 92. In some embodiments, the first barrier layer 92 may include a semiconductor material, and the second barrier layer 94 may include an oxide. For example, the first barrier layer 92 may include polysilicon, and the second barrier layer 94 may include silicon oxide. A thickness (e.g., in the vertical direction) of the first barrier layer 92 may be greater than a thickness (e.g., in the vertical direction) of the second barrier layer 94.

Figure 10B:
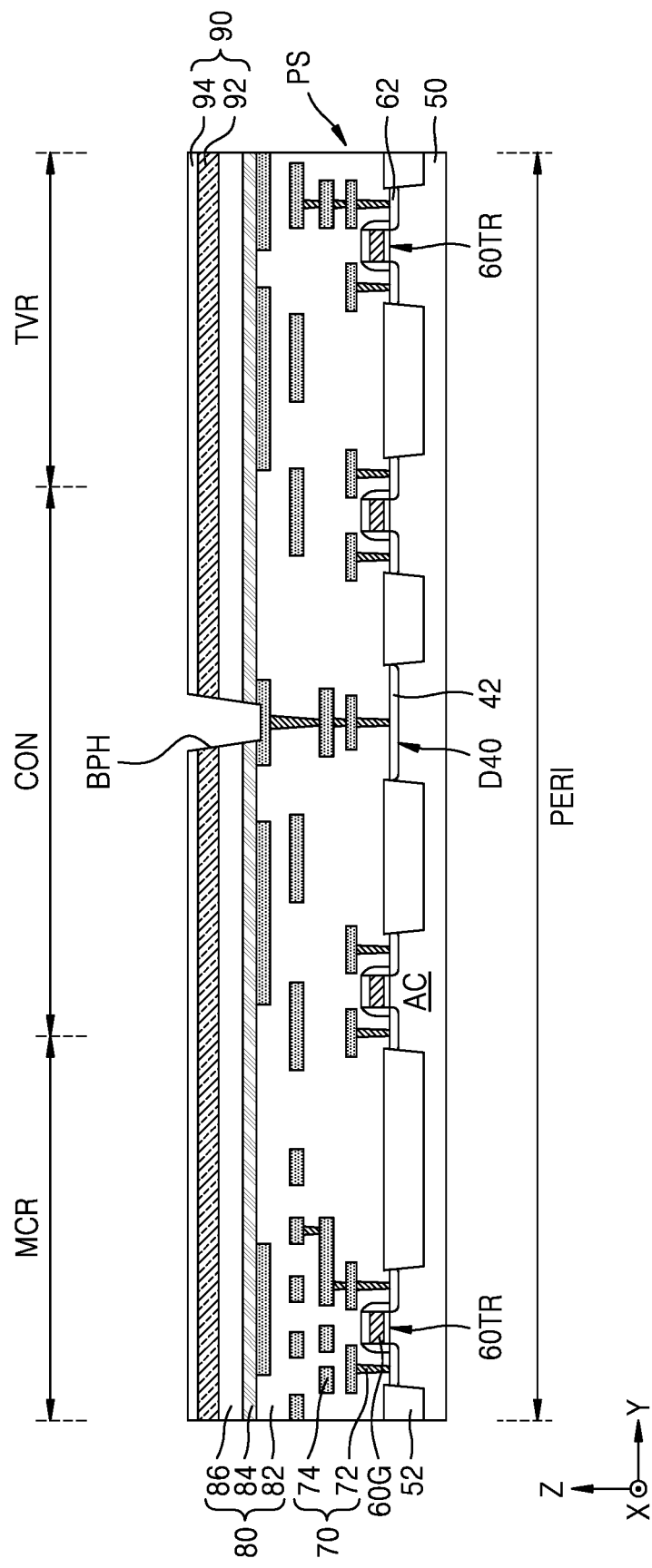

Referring to FIG. 10B, the bypass hole BPH is formed by penetrating the barrier layer 90 and exposing a portion the peripheral wiring circuit 70. The bypass hole BPH may be formed by penetrating the barrier layer 90 and a portion of the interlayer insulating layer 80. For example, the bypass hole BPH may penetrate the second barrier layer 94, the first barrier layer 92, the second interlayer insulating layer 86, and the passivation layer 84.

Figure 10C:
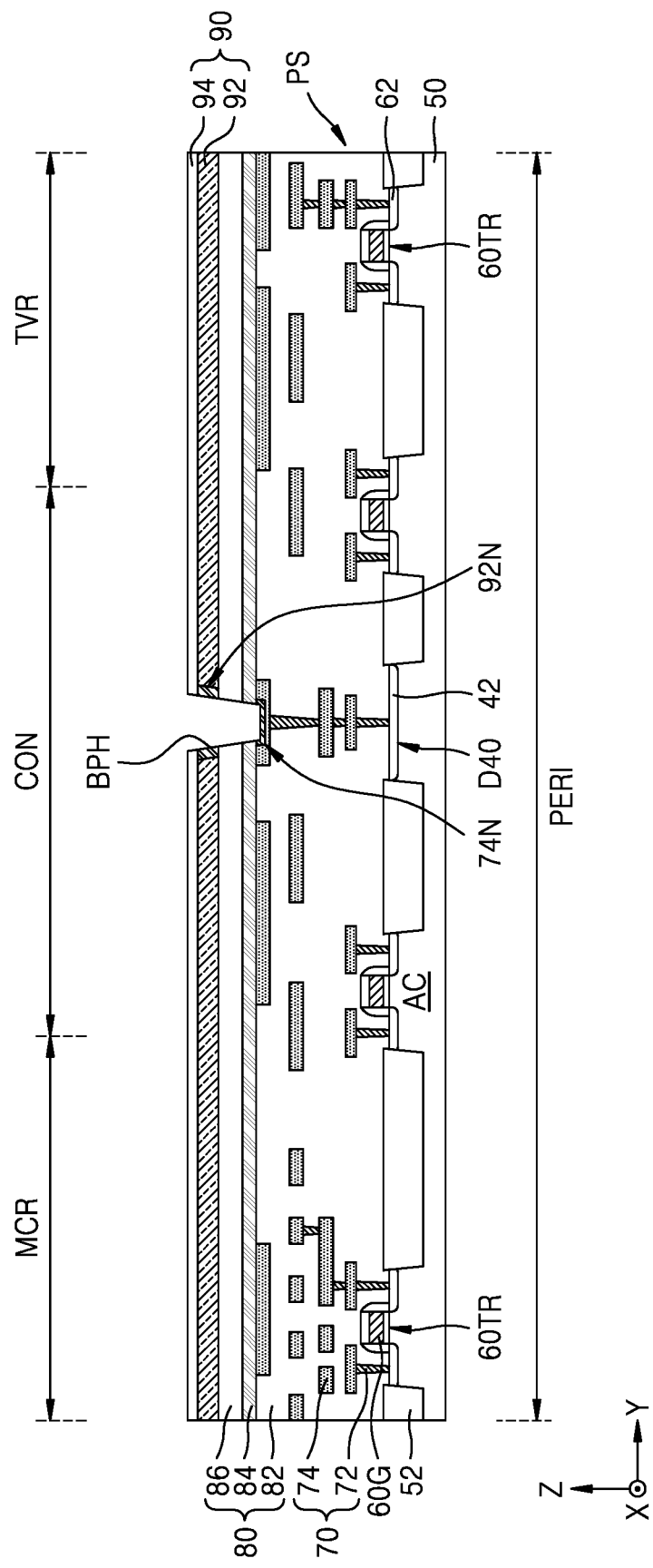

Referring to FIG. 10C, the cover layer 92N is formed by performing a plasma nitridation process on a resultant of FIG. 10B and nitriding a portion of the first barrier layer 92 exposed to the bypass hole BPH, and the cover contact layer 74N is formed by nitriding a portion of a peripheral circuit wiring layer of the plurality of peripheral circuit wiring layers 74 exposed by the hole BPH.

Figure 10D:
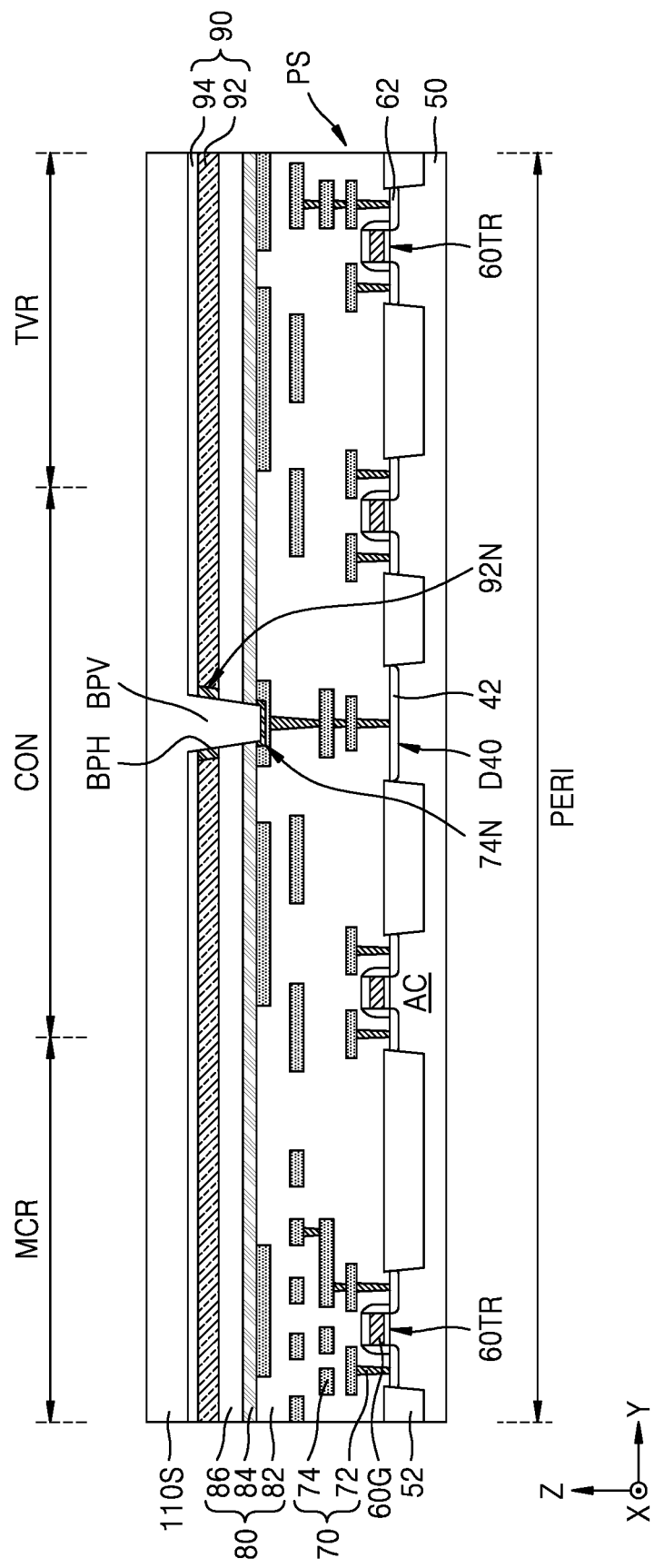

Referring to FIG. 10D, the substrate layer 110S is formed on the barrier layer 90. The bypass via BPV may be integrally formed with the substrate layer 110S. In some embodiments, a semiconductor material is formed on the barrier layer 90 to form the substrate layer 110S, and a portion of the semiconductor material may fill (e.g., be disposed in) the bypass hole BPH so that the bypass via BPV may be formed together with the substrate layer 110S.

Figure 10E:
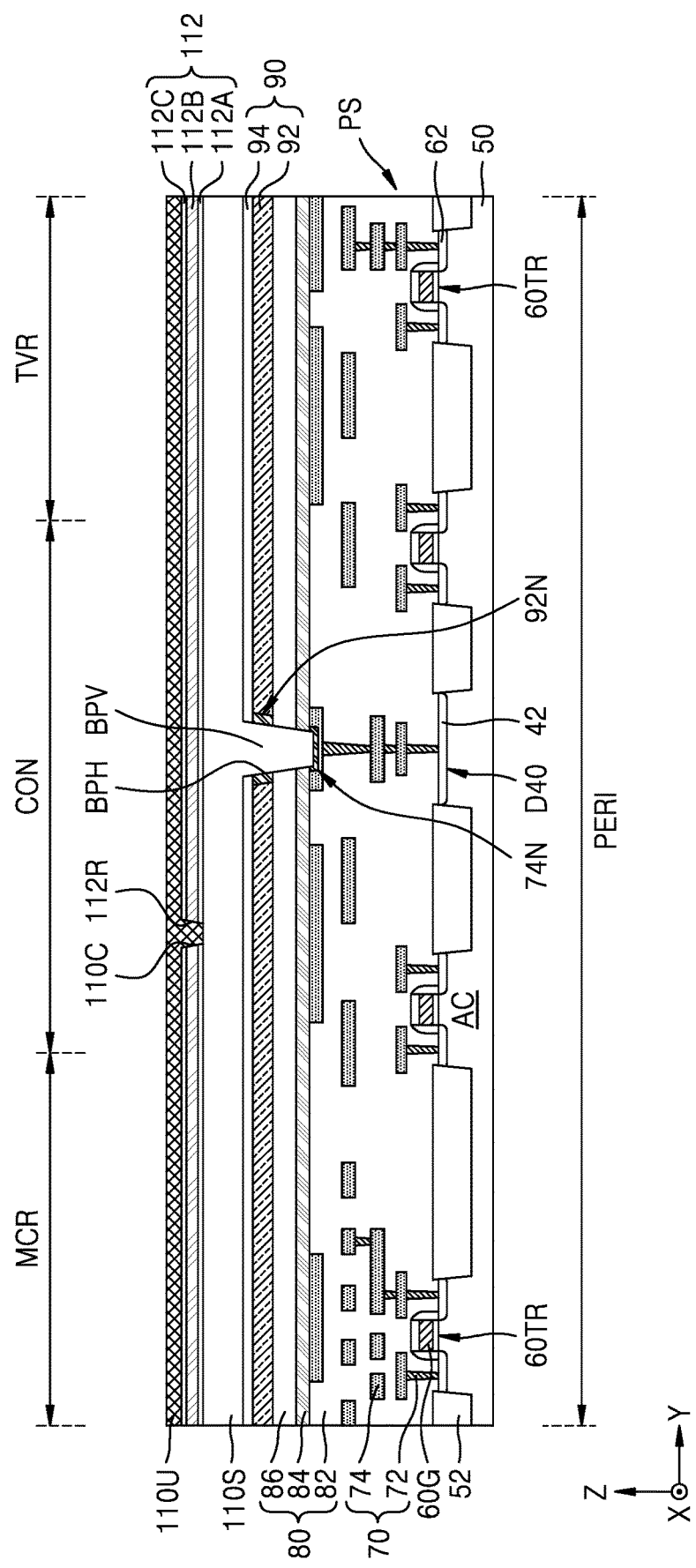

Referring to FIG. 10E, the insulating plate 112 and the upper base layer 110U are sequentially formed on the substrate layer 110S. The base dam portion 110C may be formed together with the upper base layer 110U to form an integral body. Thereafter, the plate recess 112R that penetrates the insulating plate 112 is formed by removing a portion of the insulating plate 112, the base dam portion 110C filled in (e.g., disposed in) the plate recess 112R and the upper base layer 110U that covers the insulating plate 112.

Figure 10F:
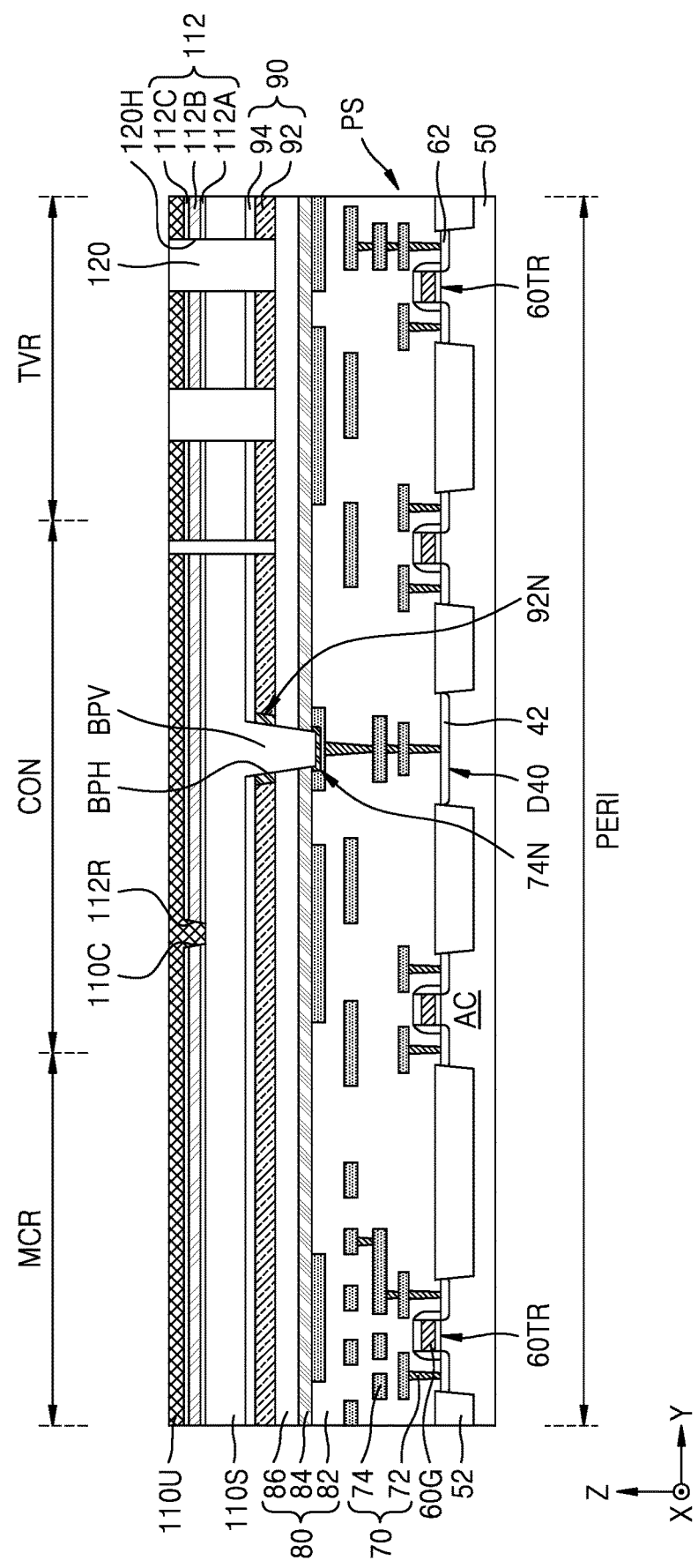

Referring to FIG. 10F, in the through electrode region TVR, the plurality of holes 120H that penetrate a structure in which the substrate layer 110S, the insulating plate 112, and the upper base layer 110U are sequentially stacked is formed. The interlayer insulating layer 80 may be at least partially exposed by the plurality of holes 120H. Thereafter, the base insulating layer 120 that fills (e.g., is disposed in) the plurality of holes 120H is formed.

Thereafter, referring to FIGS. 4A to 4C, the first gate stack GS1, the second gate stack GS2, the plurality of channels 160, the plurality of pad contacts CNT, the plurality of through electrodes TVS, and the plurality of bit lines BL are formed. The lower base layer 110L may be formed by removing a portion of the insulating plate 112 positioned on one side with respect to the base dam portion 110C (for example, a side facing the memory cell region MCR) and then filling a space from which the portion of the insulating plate 112 has been removed.

Figure 11A:
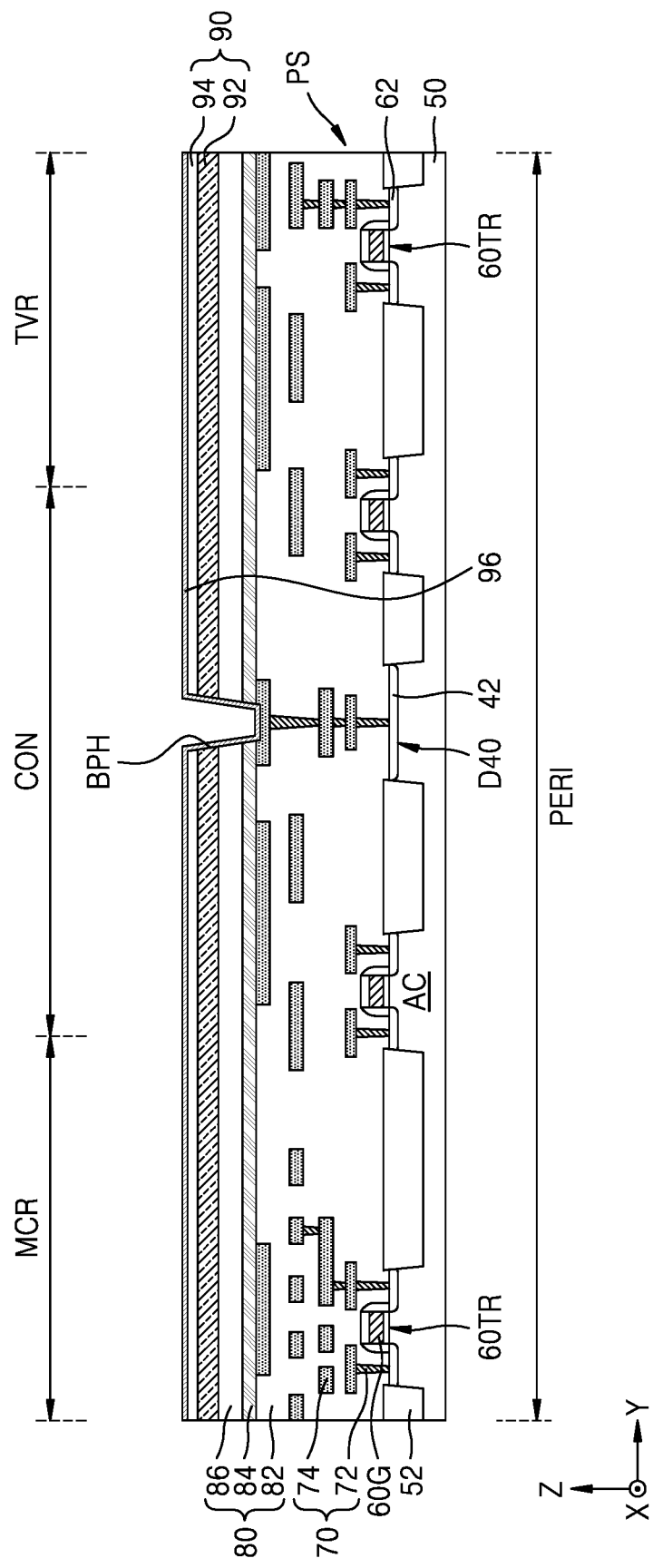
FIGS. 11A and 11B are cross-sectional views that illustrate a process of manufacturing the integrated circuit device of FIG. 7A.
Figure 11B:
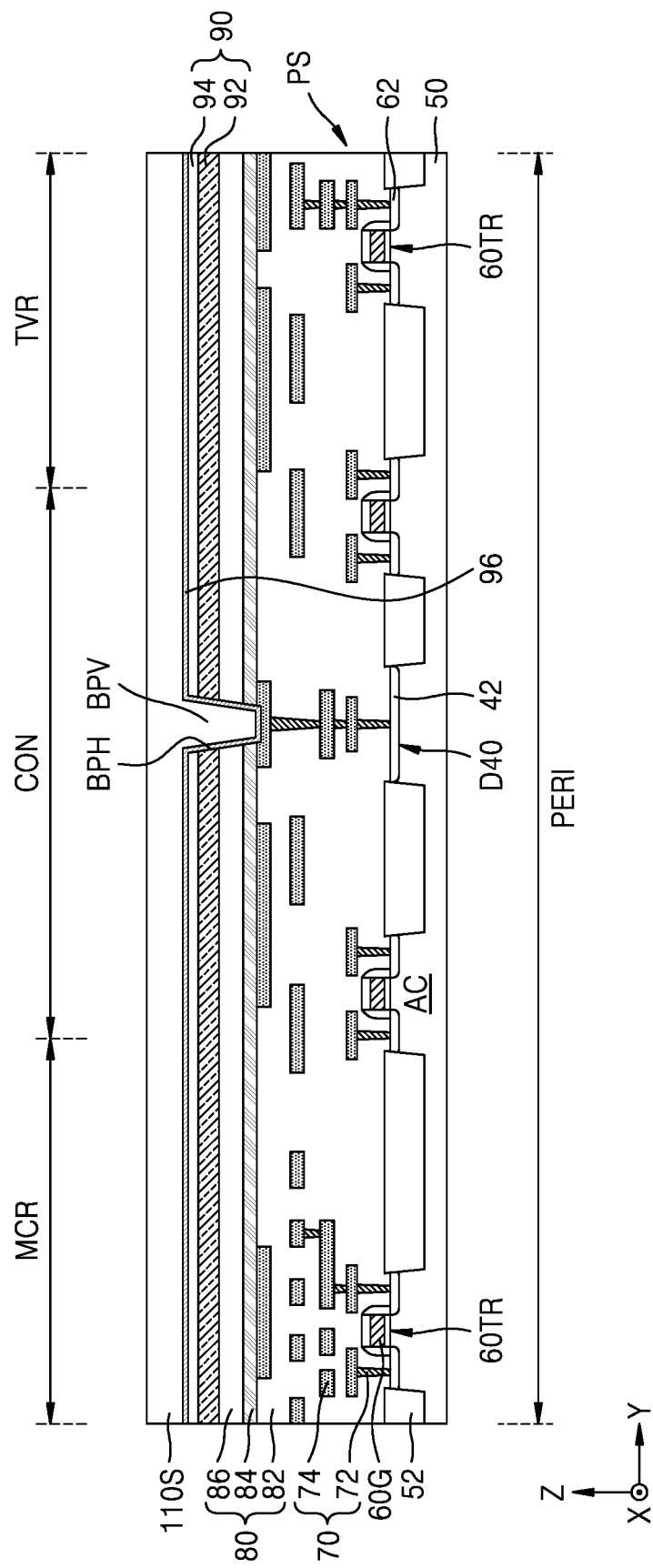

FIGS. 11A and 11B are cross-sectional views that illustrate a process of manufacturing an integrated circuit device according to embodiments of the inventive concept. Specifically, FIGS. 11A and 11B are cross-sectional views that illustrate a process of manufacturing the integrated circuit device 200 shown in FIGS. 7A and 7B.

Referring to FIG. 11A, on a resultant shown in FIG. 10C, the cover layer 96 that covers a top surface of the barrier layer 90 (i.e., a top surface of the second barrier layer 94) and portions of outer surfaces of the plurality of peripheral circuit wiring layers 74, the interlayer insulating layer 80, and the barrier layer 90 exposed by the bypass hole BPH is formed. The cover layer 96 may be formed to conformally cover the top surface of the second barrier layer 94 and the portions of outer surfaces of the plurality of peripheral circuit wiring layers 74, the interlayer insulating layer 80, and the barrier layer 90 exposed by the bypass hole BPH.

Referring to FIG. 11B, the substrate layer 110S is formed on the cover layer 96. The bypass via BPV may be integrally formed with the substrate layer 110S. In some embodiments, a semiconductor material is formed on the cover layer 96 to form the substrate layer 110S, and a portion of the semiconductor material may be filled in (e.g., disposed in) the bypass hole BPH so that the bypass via BPV may be formed together with the substrate layer 110S.

Thereafter, the integrated circuit device 200 may be further formed with reference to the manufacturing method described with reference to FIGS. 10E and 10F and the description of FIGS. 7A and 7B.

Figure 12A:
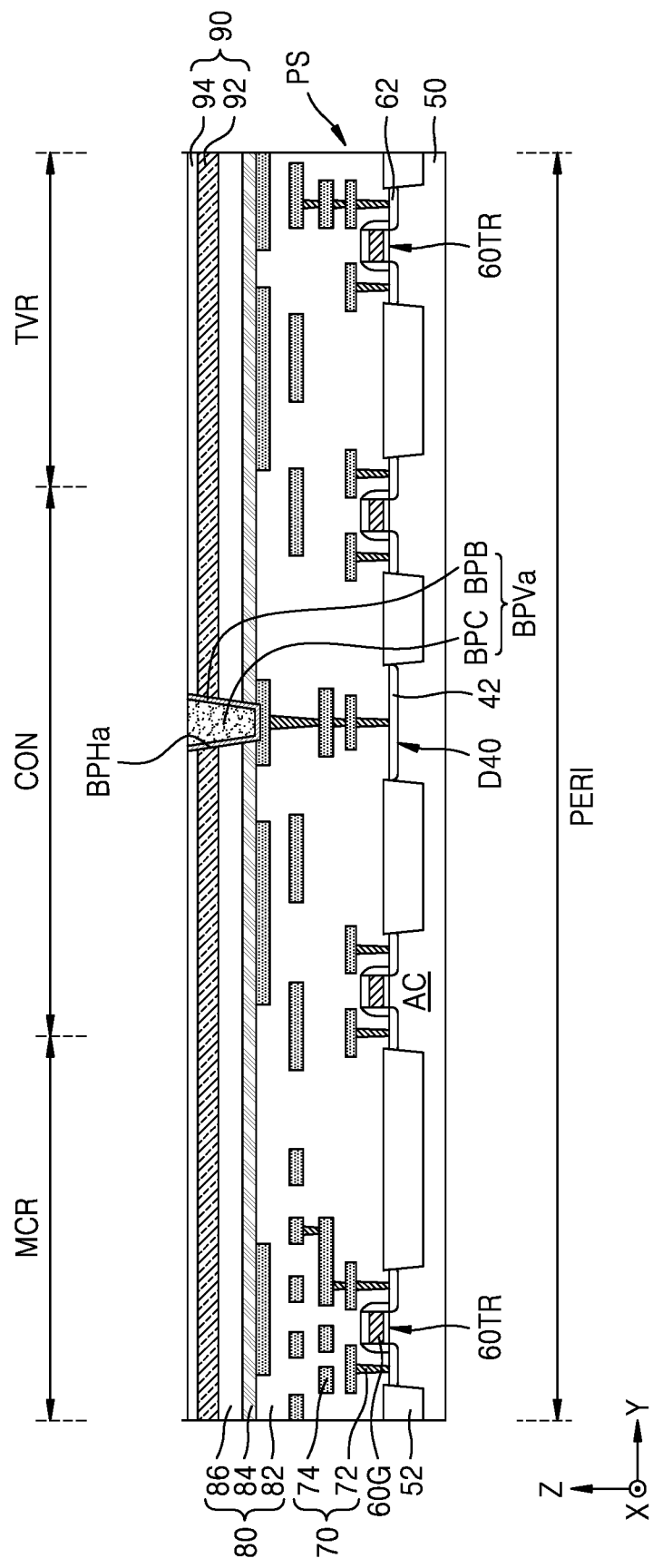
FIGS. 12A and 12B are cross-sectional views that illustrate a process of manufacturing the integrated circuit device of FIG. 8A.
Figure 12B:
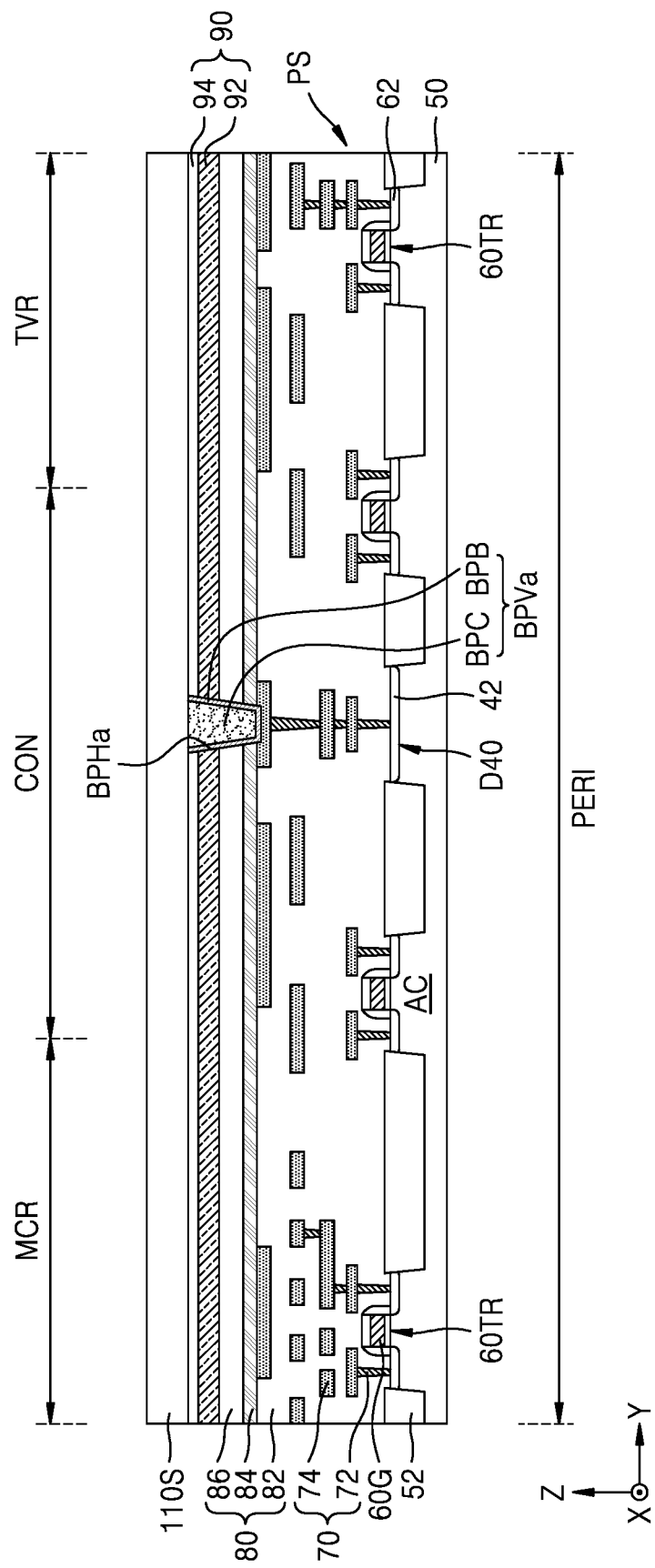

FIGS. 12A and 12B are cross-sectional views that illustrate a process of manufacturing an integrated circuit device according to embodiments of the inventive concept. Specifically, FIGS. 12A and 12B are cross-sectional views that illustrate the process of manufacturing the integrated circuit device 300 shown in FIGS. 8A and 8B.

Referring to FIG. 12A, the bypass via BPVa that fills (e.g., is disposed in) the bypass hole BPHa is formed in a resultant shown in FIG. 10C. The bypass via BPVa may include the bypass barrier layer BPB and the bypass conductive layer BPC. The bypass barrier layer BPB may be formed to at least partially conformally cover portions of outer surfaces of the plurality of peripheral circuit wiring layers 74, the interlayer insulating layer 80, and the barrier layer 90 exposed by the bypass hole BPHa, and the bypass conductive layer BPC may be formed to at least partially cover the bypass barrier layer BPB and to fill (e.g., be disposed in) the bypass hole BPHa.

Referring to FIG. 12B, the substrate layer 110S is formed on the barrier layer 90 and the bypass via BPVa. Thereafter, the integrated circuit device 300 may be further formed with reference to the manufacturing method described with reference to FIGS. 10E and 10F and the description of FIGS. 8A and 8B.

Similarly, the integrated circuit device 302 shown in FIGS. 9A and 9B may be formed by sequentially forming the insulating plate 112 and the upper base layer 110U on the substrate layer 110S, and then forming the bypass hole BPHb and the bypass via BPVb in the bypass hole BPHb.

Figure 13:
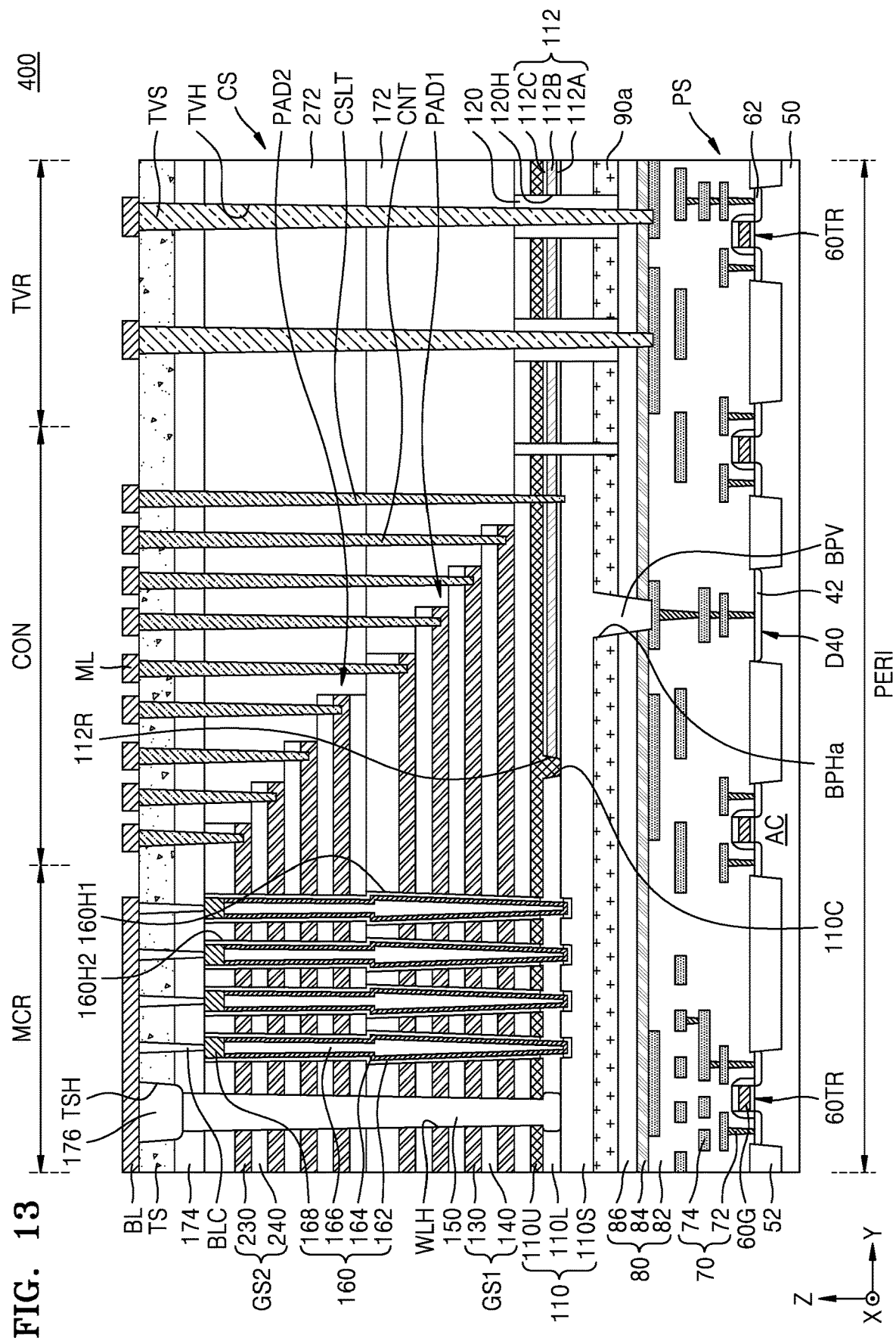
FIGS. 13 and 14 are cross-sectional views of an integrated circuit device according to embodiments of the inventive concept.
Figure 14:
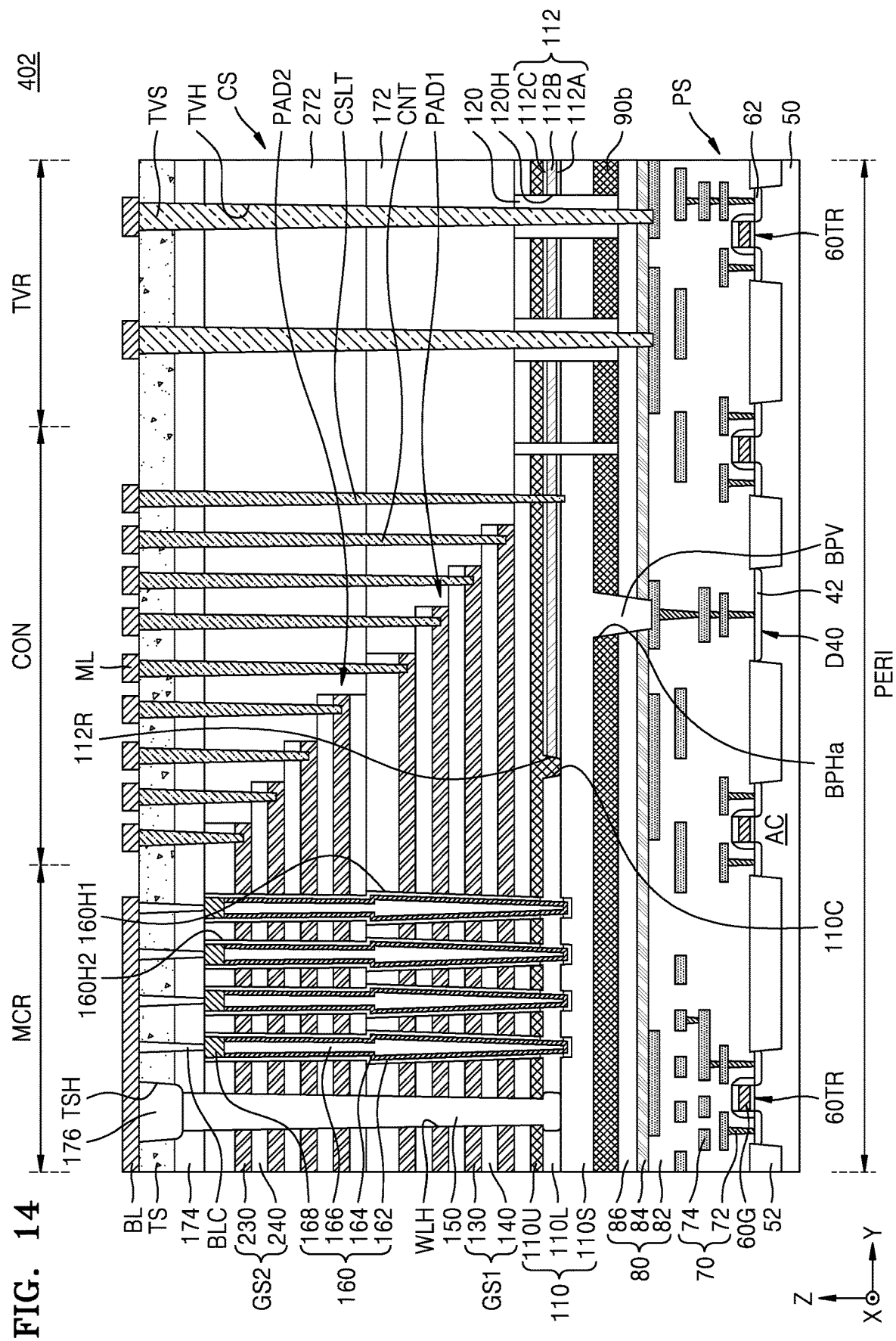

FIGS. 13 and 14 are cross-sectional views of integrated circuit device 400 and integrated circuit device 402 according to embodiments of the inventive concept. The integrated circuit device 400 and the integrated circuit device 402 are examples of, or include aspects of, the integrated circuit devices described with reference to FIGS. 1 to 12B. Redundant descriptions of similar elements illustrated by FIGS. 13 and 14 and FIGS. 4A to 12B may be omitted.

Referring to FIG. 13, the integrated circuit device 400 may include the peripheral circuit PS and the memory cell array CS disposed at a vertical level higher than that of the peripheral circuit PS (i.e., the memory cell array CS disposed above the peripheral circuit PS). The memory cell array CS may include the memory cell region MCR, the connection region CON, and the through electrode region TVR, and the peripheral circuit PS may include the peripheral circuit region PERI.

A barrier layer 90a may be disposed on the interlayer insulating layer 80. The bypass hole BPH may penetrate the barrier layer 90a and a portion of the interlayer insulating layer 80. At least a portion of a peripheral circuit wiring layer of the plurality of peripheral circuit wiring layers 74 of the peripheral wiring circuit 70 may be exposed by the bypass hole BPH. The bypass via BPV may be disposed in the bypass hole BPH.

The barrier layer 90a may include a material different from that of the substrate layer 110s. In some embodiments, the barrier layer 90a may include a material resistant to etching of the substrate layer 110S. For example, the barrier layer 90a may include a metal oxide. In some embodiments, the barrier layer 90a may include $Al_2O_3$, $HfO_2$, $ZrO_2$, etc. In some embodiments, the barrier layer 90a might not be removed and a portion of the substrate layer 110S is removed during a manufacturing process.

Referring to FIG. 14, the integrated circuit device 402 may include the peripheral circuit PS and the memory cell array CS disposed at a vertical level higher than that of the peripheral circuit PS (i.e., the memory cell array CS disposed above the peripheral circuit PS). The memory cell array CS may include the memory cell region MCR, the connection region CON, and the through electrode region TVR, and the peripheral circuit PS may include the peripheral circuit region PERI.

A barrier layer 90b may be disposed on the interlayer insulating layer 80. The bypass hole BPH may penetrate the barrier layer 90b and a portion of the interlayer insulating layer 80. At least a portion of a peripheral circuit wiring layer of the plurality of peripheral circuit wiring layers 74 of the peripheral wiring circuit 70 may be exposed by the bypass hole BPH. The bypass via BPV may be disposed in the bypass hole BPH.

The barrier layer 90b may include a material different from that of the substrate layer 110S. In some embodiments, the barrier layer 90b may include a material resistant to etching of the substrate layer 110S. For example, the barrier layer 90b may include metal. The barrier layer 90b may include oxide. In some embodiments, the barrier layer 90b may include W (tungsten), etc. In some embodiments, the barrier layer 90b might not be removed and a portion of the substrate layer 110S is removed during a manufacturing process.

Figure 15:
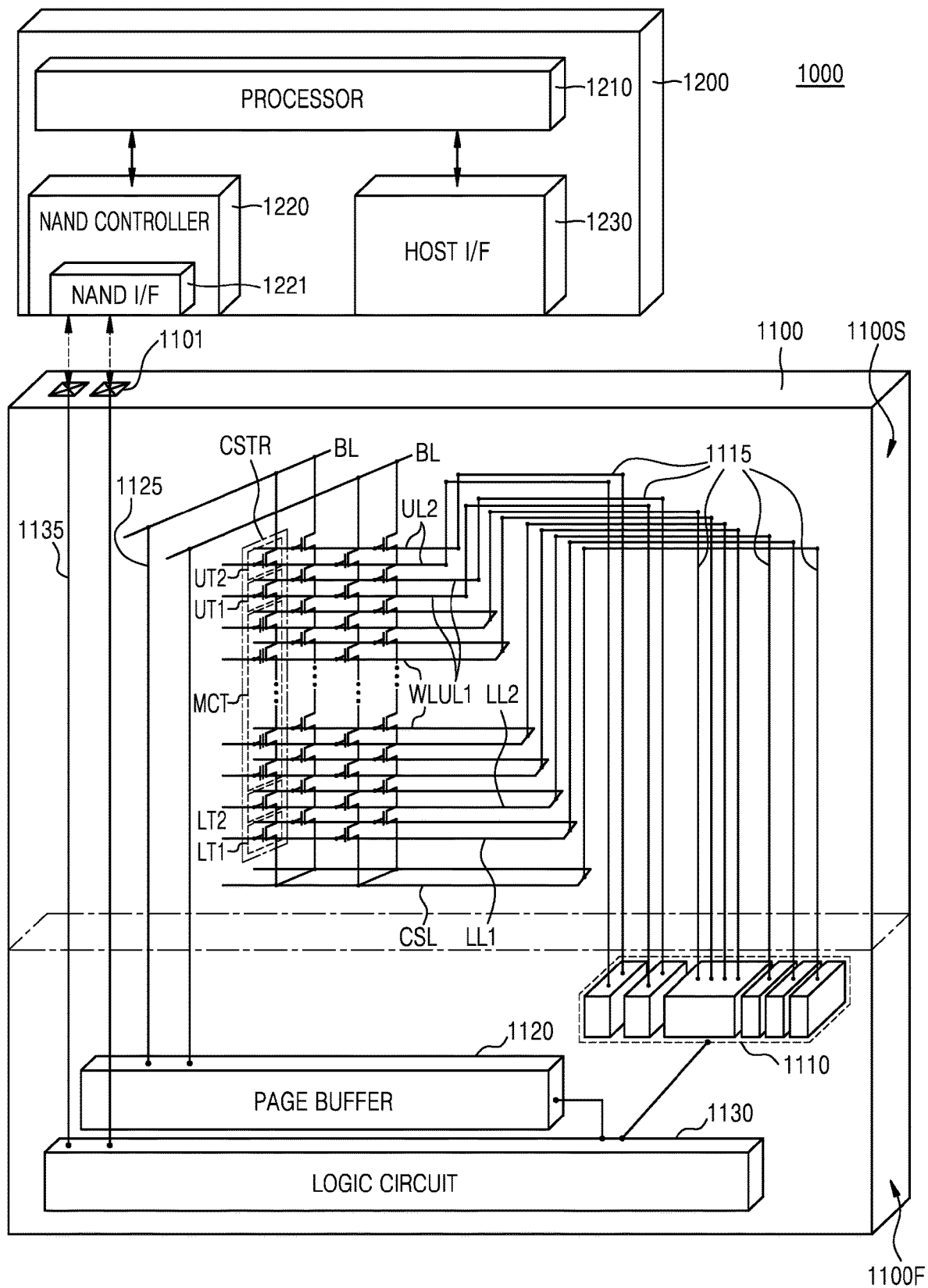
FIG. 15 is a schematic diagram of an electronic system that includes an integrated circuit device according to embodiments of the inventive concept.

FIG. 15 is a schematic diagram of an electronic system 1000 that includes an integrated circuit device 1100 according to embodiments of the inventive concept. The integrated circuit device 1100 may be an example of, or include aspects of, the integrated circuit devices described with reference to FIGS. 1 to 14.

Referring to FIG. 15, the electronic system 1000 according to an embodiment of the inventive concept may include the integrated circuit device 1100 and a controller 1200 electrically connected to the integrated circuit device 1100. The electronic system 1000 may be a storage device that includes one or more integrated circuit devices 1100 and/or an electronic device that includes a storage device. For example, the electronic system 1000 may be a solid state drive device (SSD) device, a universal serial bus (USB) device, a computing system, a medical device, or a communication device that includes at least one integrated circuit device 1100.

The integrated circuit device 1100 may be a nonvolatile memory device. For example, the integrated circuit device 1100 may be a NAND flash memory device that includes at least one of the elements of the integrated circuit devices 10, 100, 100-1a, 100-1b, 100-1c, 100-2a, 100-2b, 100-2c, 200, 300, 302, 400, or 402 respectively described with reference to FIGS. 1 to 14. The integrated circuit device 1100 may include a first structure 1100F and a second structure 1100S disposed on the first structure 1100F. The first structure 1100F may be a peripheral circuit that includes a decoder circuit 1110, a page buffer 1120, and a logic circuit 1130. The second structure 1100S may be a memory cell structure that includes the plurality of bit lines BL, the common source line CSL, the plurality of word lines WL, gate upper lines UL1 and UL2, gate lower lines LL1 and LL2, and a plurality of memory cell strings CSTR disposed between the plurality of bit lines BL and the common source line CSL.

In the second structure 1100S, each memory cell string of the plurality of memory cell strings CSTR may include lower transistors LT1 and LT2 adjacent to the common source line CSL, upper transistors UT1 and UT2 adjacent to a bit line of the plurality of bit lines BL, and a plurality of memory cell transistors MCT arranged between the lower transistors LT1 and LT2 and the upper transistors UT1 and UT2. The number of lower transistors and the number of upper transistors may be modified in various ways in various embodiments.

In some embodiments, the upper transistors UT1 and UT2 may each include a string selection transistor, and the lower transistors LT1 and LT2 may each include a ground selection transistor. The gate lower lines LL1 and LL2 may be gate lines of the lower transistors LT1 and LT2, respectively. A word line of the plurality of word lines WL may be a gate line of a memory cell transistor of the plurality of memory cell transistors MCT, and the gate upper lines UL1 and UL2 may be gate lines of the upper transistors UT1 and UT2, respectively.

The common source line CSL, the gate lower lines LL1 and LL2, the plurality of word lines WL, and the gate upper lines UL1 and UL2 may be electrically connected to the decoder circuit 1110 through a plurality of first connection wires 1115 that extend up to the second structure 1100S from the first structure 1100F. The plurality of bit lines BL may be electrically connected to the page buffer 1120 through a plurality of second connection wires 1125 that up to the second structure 1100S from the first structure 1100F.

In the first structure 1100F, the decoder circuit 1110 and the page buffer 1120 may perform a control operation on at least one memory cell transistor of the plurality of memory cell transistors MCT. The decoder circuit 1110 and the page buffer 1120 may be controlled by the logic circuit 1130.

The integrated circuit device 1100 may communicate with the controller 1200 through an input/output pad 1101 electrically connected to the logic circuit 1130. The input/output pad 1101 may be electrically connected to the logic circuit 1130 through an input/output connection line 1135 extending up to the second structure 1100S from the first structure 1100F.

The controller 1200 may include a processor 1210, a NAND controller 1220, and a host interface 1230. According to embodiments, the electronic system 1000 may include a plurality of integrated circuit devices 1100, and in this case, the controller 1200 may control the plurality of integrated circuit devices 1100.

The processor 1210 may control the overall operation of the electronic system 1000 including the controller 1200. The processor 1210 may operate according to certain firmware, and may access the integrated circuit device 1100 by controlling the NAND controller 1220. The NAND controller 1220 may include a NAND interface 1221 that communicates with the integrated circuit device 1100. A control command for controlling the integrated circuit device 1100, data to be written to the plurality of memory cell transistors MCT of the integrated circuit device 1100, data to be read from the plurality of memory cell transistors MCT of the integrated circuit device 1100, etc. may be transmitted through the NAND interface 1221. The host interface 1230 may provide a communication function between the electronic system 1000 and an external host. Upon receiving the control command from the external host through the host interface 1230, the processor 1210 may control the integrated circuit device 1100 in response to the control command.

Figure 16:
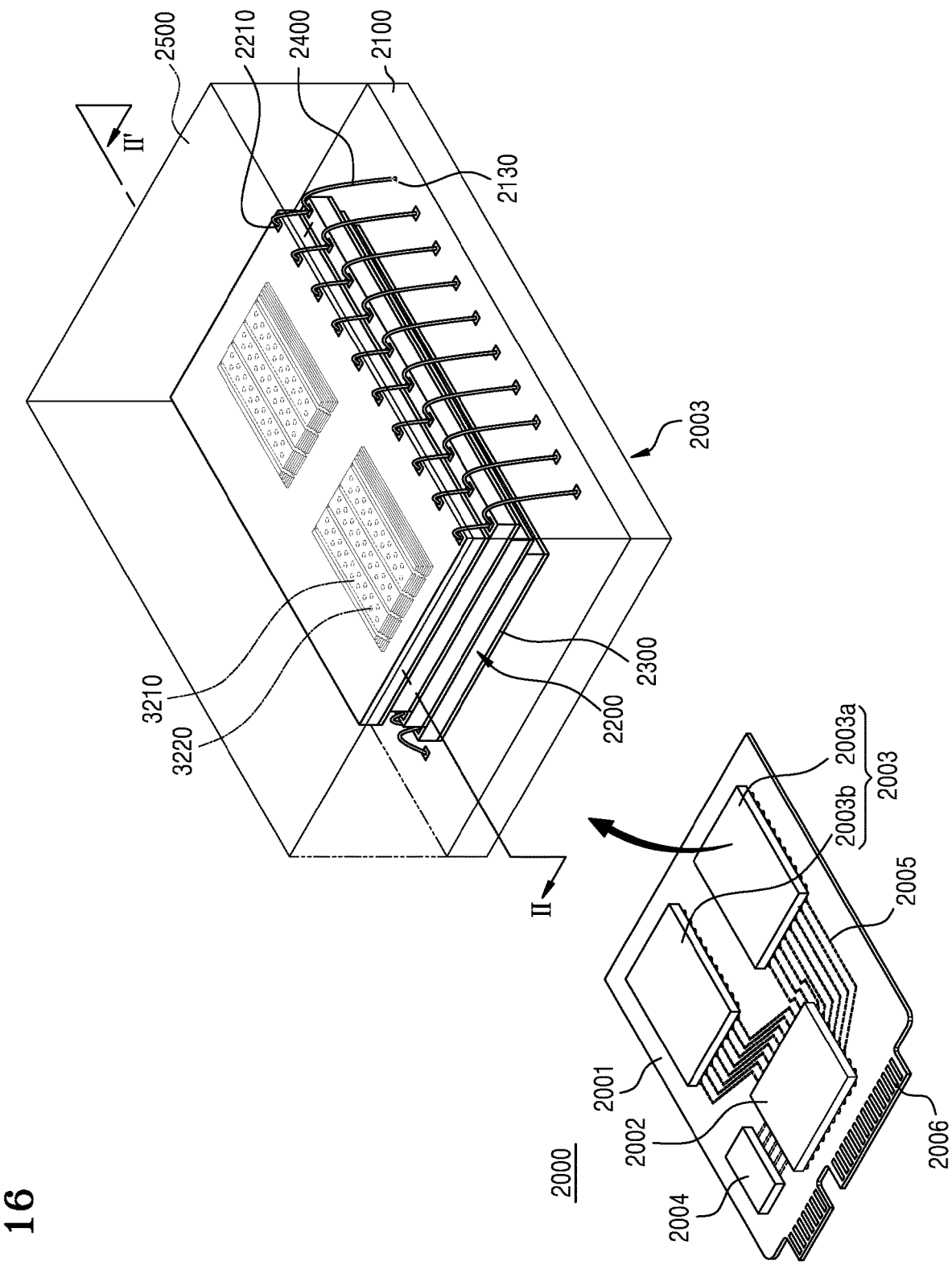
FIG. 16 is a perspective view of an electronic system that includes an integrated circuit device according to embodiments of the inventive concept.

FIG. 16 is a perspective view of an electronic system 2000 that includes an integrated circuit device according to embodiments of the inventive concept.

Referring to FIG. 16, the electronic system 2000 according to an embodiment of the inventive concept may include a main substrate 2001, a controller 2002 mounted on the main substrate 2001, one or more semiconductor packages 2003, and a DRAM 2004. The semiconductor package 2003 and the DRAM 2004 may be connected to the controller 2002 by a plurality of wiring patterns 2005 formed on the main substrate 2001.

The main substrate 2001 may include a connector 2006 including pins coupled to an external host. The number and arrangement of pins in the connector 2006 may vary according to a communication interface between the electronic system 2000 and the external host. In embodiments, the electronic system 2000 may communicate with the external host according to any one of interfaces such as Universal Serial Bus (USB), Peripheral Component Interconnect Express (PCI-Express), Serial Advanced Technology Attachment (SATA), M-Phy for Universal Flash Storage (UFS), etc. In some embodiments, the electronic system 2000 may operate by power supplied from the external host through the connector 2006. The electronic system 2000 may further include a power management integrated circuit (PMIC) that distributes the power supplied from the external host to the controller 2002 and the semiconductor package 2003.

The controller 2002 may write data to or read data from the semiconductor package 2003, and may improve an operating speed of the electronic system 2000.

The DRAM 2004 may be a buffer memory for reducing a speed difference between the semiconductor package 2003 (e.g., a data storage space) and the external host. The DRAM 2004 included in the electronic system 2000 may operate as a kind of cache memory and may provide a space for temporarily storing data during a control operation on the semiconductor package 2003. When the DRAM 2004 is included in the electronic system 2000, the controller 2002 may further include a DRAM controller for controlling the DRAM 2004 in addition to the NAND controller for controlling the semiconductor package 2003.

The semiconductor package 2003 may include a first semiconductor package 2003a and a second semiconductor package 2003b spaced apart from each other. Each of the first semiconductor package 2003a and the second semiconductor package 2003b may be a semiconductor package that includes a plurality of semiconductor chips 2200. Each of the first semiconductor package 2003a and the second semiconductor package 2003b may include a package substrate 2100, a plurality of semiconductor chips 2200 on the package substrate 2100, an adhesive layer 2300 disposed on a lower surface of each of the plurality of semiconductor chips 2200, a connection structure 2400 that electrically connects the plurality of semiconductor chips 2200 and the package substrate 2100, and a molding layer 2500 that covers the plurality of semiconductor chips 2200 and the connection structure 2400 on the package substrate 2100.

The package substrate 2100 may be a printed circuit board that includes a plurality of package upper pads 2130. Each of the plurality of semiconductor chips 2200 may include an input/output pad 2210. The input/output pad 2210 may correspond to the input/output pad 1101 of FIG. 13. For example, the input/output pad 2210 is an example of, or includes aspects of, the input/output pad 1101 of FIG. 13. Each semiconductor chip of the plurality of semiconductor chips 2200 may include a plurality of gate stacks 3210 and a plurality of channels 3220. Each semiconductor chip of the plurality of semiconductor chips 2200 may include at least one of the integrated circuit devices 10, 100, 100-1a, 100-1b, 100-1c, 100-2a, 100-2b, 100-2c, 200, 300, 302, 400, and 402 respectively described with reference to FIGS. 1 to 14.

In some embodiments, the connection structure 2400 may be a bonding wire that electrically connects the input/output pad 2210 and the plurality of package upper pads 2130. Accordingly, in each of the first semiconductor package 2003a and the second semiconductor package 2003b, semiconductor chips of the plurality of semiconductor chips 2200 may be electrically connected to each other by a bonding wire method and may be electrically connected to the plurality of package upper pads 2130 of the package substrate 2100. According to some embodiments, in the first semiconductor package 2003a and the second semiconductor package 2003b, semiconductor chips of the plurality of semiconductor chips 2200 may be electrically connected to each other by a connection structure that includes the through silicon via TSV and omits the bonding wire type connection structure 2400.

In some embodiments, the controller 2002 and the plurality of semiconductor chips 2200 may be included in one package. In an embodiment, the controller 2002 and the plurality of semiconductor chips 2200 are mounted on a separate interposer substrate different from the main substrate 2001, and the controller 2002 and the plurality of semiconductor chips 2200 may be connected to each other by a wiring formed on the interposer substrate.

Figure 17:
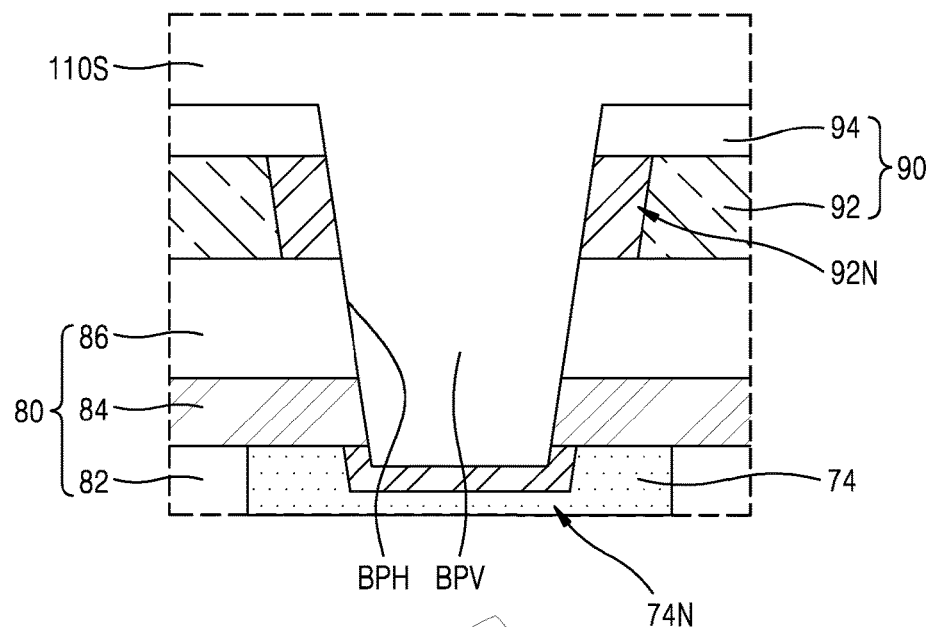
FIG. 17 is a cross-sectional view of a semiconductor package according to embodiments of the inventive concept.
Figure 17:
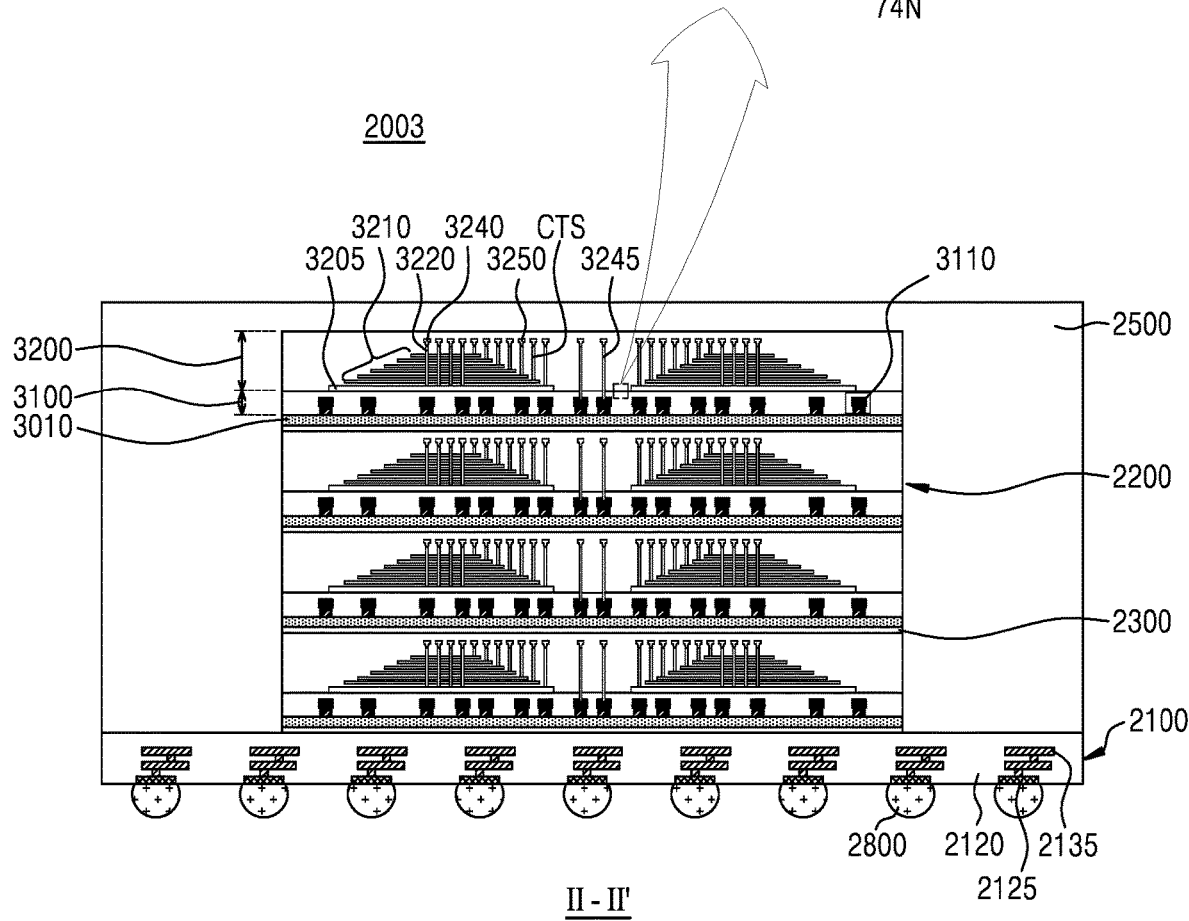

FIG. 17 is a cross-sectional view of the semiconductor package 2003 according to embodiments of the inventive concept. FIG. 17 shows a configuration of a cross section taken along the line II-II' of FIG. 16 in more detail.

Referring to FIG. 17, in the semiconductor package 2003, the package substrate 2100 may be a printed circuit board. The package substrate 2100 may include a package substrate body 2120, the plurality of package upper pads 2130 (shown in FIG. 16) arranged on a top surface of the package substrate body 2120, a plurality of lower pads 2125 arranged on a lower surface of the package substrate body 2120 or exposed through the lower surface, and a plurality of internal wirings 2135 that electrically connect the plurality of upper pads 2130 and the plurality of lower pads 2125 inside the package substrate body 2120. The plurality of package upper pads 2130 may be electrically connected to the plurality of connection structures 2400. The plurality of lower pads 2125 may be connected to the plurality of wiring patterns 2005 on the main substrate 2001 of the electronic system 2000 illustrated in FIG. 16 through a plurality of conductive connectors 2800.

Each semiconductor chip of the plurality of semiconductor chips 2200 may include a semiconductor substrate 3010, a first structure 3100, and a second structure 3200 sequentially stacked on the semiconductor substrate 3010. For example, the first structure 3100 may be disposed above the semiconductor substrate 3010, and the second structure 3200 may be disposed above the first structure 3100. The first structure 3100 may include a peripheral circuit region that includes a plurality of peripheral wirings 3110. The first structure 3100 may include the gate lines electrically connected to the plurality of peripheral wirings 3110. The second structure 3200 may include a common source line 3205, a gate stack 3210 on the common source line 3205, channels 3220 penetrating the gate stack 3210, a bit line 3240 electrically connected to the channels 3220, and a gate stack 3210.

The barrier layer 90 may be interposed between the first structure 3100 and the second structure 3200. In some embodiments, the barrier layer 90 may include a stacked structure in which the first barrier layer 92 covers the interlayer insulating layer 80 and the second barrier layer 94 covers the first barrier layer 92. The bypass via BPV may be disposed in the bypass hole BPH that penetrates the barrier layer 90. In some embodiments, the cover layer 92N may be interposed between the bypass via BPV and the first barrier layer 92. In some embodiments, the cover contact layer 74N may be interposed between the bypass via BPV and a peripheral circuit wiring layer of the plurality of peripheral circuit wiring layers 74.

In FIG. 17, each semiconductor chip of the plurality of semiconductor chips 2200 includes the barrier layer 90, the bypass hole BPH, the bypass via BPV, the cover layer 92N, and the cover contact layer 74N shown in FIGS. 4A to 4C, but is not limited thereto. For example, each semiconductor chip of the plurality of semiconductor chips 2200 may omit the barrier layer 90, the bypass hole BPH, the bypass via BPV, the cover layer 92N, and the cover contact layer 74N shown in FIGS. 4A to 4C and may include: the barrier layer 90, the bypass hole BPH, the bypass via BPV, and the cover layer 96 shown in FIGS. 7A and 7B; the barrier layer 90, the bypass hole BPHa, and the bypass via BPVa shown in FIGS. 8A and 8B; the barrier layer 90, the bypass hole BPHb, and the bypass via BPVb shown in FIGS. 9A and 9B; the barrier layer 90a, the bypass hole BPH, and the bypass via BPV shown in FIG. 13; or the barrier layer 90b, the bypass hole BPH, the bypass via BPV shown in FIG. 14.

Each semiconductor chip of the plurality of semiconductor chips 2200 may include a through wiring 3245 electrically connected to the plurality of peripheral wirings 3110 of the first structure 3100 and that extends into the second structure 3200. The through wiring 3245 may be disposed outside the gate stack 3210. In some embodiments, the semiconductor package 2003 may include a through wiring penetrating the gate stack 3210. Each semiconductor chip of the plurality of semiconductor chips 2200 may further include an input/output pad (e.g., the input/output pad 2210 of FIG. 14) electrically connected to the plurality of peripheral wirings 3110 of the first structure 3100.

While the inventive concept has been particularly shown and described with reference to embodiments thereof, it will be understood that various changes in form and details may be made therein without departing from the spirit and scope of the present disclosure.

What is claimed is:

1. An integrated circuit device comprising:
   a substrate;
   a peripheral wiring circuit comprising a bypass via and disposed on the substrate;
      a peripheral circuit comprising an interlayer insulating layer surrounding at least a portion of the peripheral wiring circuit;
   a memory cell array disposed on and overlapping the peripheral circuit and comprising a base substrate, a plurality of gate lines disposed on the base substrate, and a plurality of channels penetrating the plurality of gate lines; and
   a barrier layer interposed between the peripheral circuit and the memory cell array and comprising a bypass hole penetrating from a top surface to a lower surface of the barrier layer, wherein the bypass via is disposed in the bypass hole;
   wherein each of at least a portion of the barrier layer and at least a portion of the base substrate includes a sequentially stacked conductive material layer, insulating material layer, semiconductor material layer, insulating material layer that includes oxide/nitride/oxide (ONO) layers, and semiconductor material layer.

2. The integrated circuit device of claim 1, further comprising:
   a plurality of conductive lines, wherein the memory cell array is disposed between the plurality of conductive lines and the barrier layer;
   a base insulating layer disposed in a plurality of holes penetrating the base substrate and the barrier layer; and
   a plurality of through electrodes penetrating the memory cell array and the base insulating layer, connecting the plurality of conductive lines to the peripheral wiring circuit,
   wherein the base insulating layer is interposed between the plurality of through electrodes and the barrier layer.

3. The integrated circuit device of claim 2, wherein:
   the plurality of holes comprise a plurality of single holes and at least one expansion hole;
   one through electrode of the plurality of through electrodes is disposed in each single hole of the plurality of single holes; and at least two through electrodes of the plurality of through electrodes are arranged in the at least one expansion hole.

4. The integrated circuit device of claim 3, wherein a separation distance between the through electrodes of the plurality of through electrodes arranged in the plurality of single holes is greater than a separation distance between the at least two through electrodes of the plurality of through electrodes arranged in the at least one expansion hole.

5. The integrated circuit device of claim 2, wherein each hole of the plurality of holes has a cross section of a circular shape, an oval shape, a rectangular shape, or a rectangular shape with round corners.

6. The integrated circuit device of claim 1, wherein:
the peripheral circuit further comprises an antenna diode disposed on the substrate; and
the bypass via is electrically connected to the antenna diode.

7. The integrated circuit device of claim 1, wherein:
the bypass via is integral with at least a part of the base substrate;
a part of the barrier layer comprises a same material as at least a part of the base substrate; and
the integrated circuit device further comprises a cover layer comprising a nitride, an oxide, a nitride comprising metal, or a metal silicide and covering at least a part of the barrier layer, interposed between at least a part of the barrier layer and the bypass via.

8. The integrated circuit device of claim 7, wherein the barrier layer includes:
a first barrier layer that covers the interlayer insulating layer and comprises a conductive material layer; and
a second barrier layer that covers the first barrier layer and comprises an insulating material layer.

9. The integrated circuit device of claim 8, wherein the cover layer is interposed between the first barrier layer and the bypass via and is omitted between the second barrier layer and the bypass via.

10. The integrated circuit device of claim 7, wherein the cover layer covers a top surface of the barrier layer and contacts side surfaces and a bottom surface of the bypass via.

11. The integrated circuit device of claim 1, wherein the bypass via comprises a metal nitride, a metal, or a combination thereof.

12. An integrated circuit device comprising:
a substrate;
a peripheral wiring circuit comprising a peripheral circuit contact, a peripheral circuit wiring layer, and a bypass via and disposed on the substrate;
a peripheral circuit comprising an interlayer insulating layer surrounding the peripheral circuit contact and the peripheral circuit wiring layer;
a memory cell array disposed on and overlapping the peripheral circuit and comprising a substrate layer, a plurality of gate lines arranged on the substrate layer, and a plurality of channels penetrating the plurality of gate lines;
a barrier layer interposed between the peripheral circuit and the memory cell array, wherein the barrier layer comprises a first barrier layer covering the interlayer insulating layer and a second barrier layer covering the first barrier layer, wherein the barrier layer further comprises a bypass hole exposing at least a portion of the peripheral circuit wiring layer, and wherein the bypass via is disposed in the bypass hole; and
a cover layer interposed between the first barrier layer and the bypass via.

13. The integrated circuit device of claim 12, wherein the cover layer is interposed between the first barrier layer and the bypass via and is omitted between the second barrier layer and the bypass via.

14. The integrated circuit device of claim 13, wherein:
each of the substrate layer, the bypass via, and the first barrier layer comprises a semiconductor material; and
each of the second barrier layer and the cover layer comprises a nitride or an oxide.

15. The integrated circuit device of claim 12, wherein the cover layer extends from between the first barrier layer and the bypass via to a top surface of the second barrier layer.

16. The integrated circuit device of claim 15, wherein the cover layer comprises a metal containing nitride or a metal silicide.

17. The integrated circuit device of claim 12, wherein the substrate layer and the bypass via are integrally formed of a same material.

18. An integrated circuit device comprising:
a peripheral circuit transistor disposed on a substrate;
a peripheral wiring circuit comprising a peripheral circuit contact, a peripheral circuit wiring layer, and a bypass via, wherein the peripheral wiring circuit is electrically connected to the peripheral circuit transistor;
a peripheral circuit surrounding the peripheral circuit contact and the peripheral circuit wiring layer;
a memory cell array disposed on and overlapping the peripheral circuit;
a substrate layer, a lower base layer, and an upper base layer that are sequentially stacked;
a plurality of gate lines arranged on the upper base layer;
a plurality of channels disposed in a plurality of channel holes penetrating the plurality of gate lines;
a barrier layer interposed between the peripheral circuit and the memory cell array, wherein the barrier layer comprises a first barrier layer covering an interlayer insulating layer and a second barrier layer covering the first barrier layer, wherein the barrier layer further comprises a bypass hole exposing at least a portion of the peripheral circuit wiring layer, and wherein a bypass via formed integrally with and comprising a same material as the substrate layer is disposed in the bypass hole;
a cover layer interposed between the bypass via and the first barrier layer;
a base insulating layer disposed in a plurality of holes penetrating the base substrate and the barrier layer;
a plurality of conductive lines arranged on the memory cell array; and
a plurality of through electrodes penetrating the memory cell array and the base insulating layer to connect the plurality of conductive lines to the peripheral wiring circuit,
the base insulating layer is disposed between the plurality of through electrodes and the barrier layer.

19. The integrated circuit device of claim 18, wherein:
each of the substrate layer and the first barrier layer comprises a semiconductor material; and
each of the second barrier layer and the cover layer comprises a material different from a material of the first barrier layer.

20. The integrated circuit device of claim 18, wherein:
each channel of the plurality of channels comprises a gate insulating layer and a channel layer sequentially arranged in outer regions of a corresponding channel hole of the plurality of channel holes;

the gate insulating layer comprises a sidewall portion and a bottom portion spaced apart from each other; and the channel layer contacts the lower base layer through the sidewall portion and the bottom portion of the gate insulating layer that are spaced apart from each other.

* * * * *